United States Patent
Dong et al.

(10) Patent No.: US 10,340,844 B2
(45) Date of Patent: Jul. 2, 2019

(54) HIGH-PERFORMANCE PLANAR SOLAR CONCENTRATORS BASED ON NANOPARTICLE DOPING

(71) Applicant: Washington State University, Pullman, WA (US)

(72) Inventors: Wenji Dong, Pullman, WA (US); Yilin Li, Seattle, WA (US)

(73) Assignee: WASHINGTON STATE UNIVERSITY, Pullman, WA (US)

( * ) Notice: Subject to any disclaimer, the term of this patent is extended or adjusted under 35 U.S.C. 154(b) by 29 days.

(21) Appl. No.: 15/587,489

(22) Filed: May 5, 2017

(65) Prior Publication Data
US 2017/0324370 A1    Nov. 9, 2017

Related U.S. Application Data

(60) Provisional application No. 62/332,195, filed on May 5, 2016.

(51) Int. Cl.
*H02S 40/22*   (2014.01)
*H02S 99/00*   (2014.01)
(Continued)

(52) U.S. Cl.
CPC ........ *H02S 40/22* (2014.12); *H01L 31/02167* (2013.01); *H01L 31/02168* (2013.01);
(Continued)

(58) Field of Classification Search
CPC ............. H01L 31/02322; H01L 31/054; H01L 31/055; H01L 31/02167; H01L 31/02168;
(Continued)

(56) References Cited

U.S. PATENT DOCUMENTS

| 8,530,739 | B2 | 9/2013 | Karg |
| 2008/0014463 | A1* | 1/2008 | Varadarajan ......... C09K 11/616 |
| | | | 428/690 |

(Continued)

FOREIGN PATENT DOCUMENTS

| CN | 101462768 A | 6/2009 |
| CN | 101787272 A | 7/2010 |

(Continued)

OTHER PUBLICATIONS

Q. Zhang et al: "Light Scattering with oxide nanocrystallite aggregates for dye-sensitized solar cell application", Journal of Nanophotonics, vol. 4, pp. 1-22, May 6, 2010.

(Continued)

*Primary Examiner* — Lindsey A Bernier
(74) *Attorney, Agent, or Firm* — W&C IP

(57) ABSTRACT

A light scattering-based solar concentrator (LSSC) uses high refractive index nanoparticles (NPs) as dopants to selectively scatter photons across the solar spectrum without spectroscopic conversion by different sized nanoparticles. The LSSCs are limited by a single parameter: the surface photon losses, which can be addressed by nanofabrication to implement anti-reflective and light trapping structures into LSSC designs. The LSSC design provides solar concentrator techniques for photovoltaic (PV) applications.

11 Claims, 32 Drawing Sheets

(51) Int. Cl.
*H01L 31/054* (2014.01)
*H01L 31/055* (2014.01)
*H01L 31/0216* (2014.01)
*H01L 31/0232* (2014.01)

(52) U.S. Cl.
CPC ...... *H01L 31/02322* (2013.01); *H01L 31/054* (2014.12); *H01L 31/055* (2013.01); *H01L 31/0547* (2014.12); *H02S 99/00* (2013.01); *Y02E 10/52* (2013.01)

(58) Field of Classification Search
CPC ..... H01L 31/0547; H02S 40/22; Y02E 10/50; Y02E 10/52; G02B 6/00; G02B 6/0003; G02B 6/0011
See application file for complete search history.

(56) References Cited

U.S. PATENT DOCUMENTS

| | | | |
|---|---|---|---|
| 2009/0056791 A1* | 3/2009 | Pfenninger | H01L 31/055 136/247 |
| 2009/0205701 A1* | 8/2009 | Govaerts | H01L 31/02322 136/247 |
| 2010/0139749 A1* | 6/2010 | Mapel | C03C 3/102 136/255 |
| 2010/0180932 A1 | 7/2010 | Wang et al. | |
| 2010/0288352 A1 | 11/2010 | Ji et al. | |
| 2010/0326519 A1* | 12/2010 | Tanase | B82Y 20/00 136/257 |
| 2011/0253198 A1* | 10/2011 | Patrick | B82Y 20/00 136/247 |
| 2013/0264470 A1* | 10/2013 | Nishiwaki | G02B 6/0036 250/216 |
| 2016/0327714 A1* | 11/2016 | Patrick | H01L 31/055 |

FOREIGN PATENT DOCUMENTS

| | | | | |
|---|---|---|---|---|
| WO | 2013/093696 A2 | 6/2013 | | |
| WO | WO-2015002995 A1 * | 1/2015 | ........... | H01L 31/055 |

OTHER PUBLICATIONS

R. Chen et al: "Optimal Design for the Diffusion Plate with Nanoparticles in the Solar Cell Window by Mie Scattering Simulation", International Journal of Photoenergy, vol. 2013, article ID 481637, pp. 1-5, Sep. 15, 2013.

K. Moon et al: "Effect of TiO2 nanoparticle-accumulated bilayer photoelectrod and condenser lens-assisted solar concentrator on light harvesting in dye-sensitized solar cells", Nanoscale Research Letters, 2013.

B. Tan et al: "Dye-Sensitized Solar Cells Based on Anatase TiO2 Nanoparticle/Nanowire Composites", J. Phys. Chem. B 2006, pp. 15932-19538, Jun. 28, 2006.

* cited by examiner

PS = 1,424 × 10⁻³ slope = 0.80019  $r^2$ = 0.98762

Ps = 1.263 × 10⁻³ slope = 0.89991  $r^2$ = 0.99648

$Ps = 1.123 \times 10^{-3}$ slope = 1.00005  $r^2 = 0.99894$ $Ps = 1.000 \times 10^{-3}$ slope = 1.09974  $r^2 = 0.99711$ Ps = 0.889 × 10⁻³ slope = 1.20019  r² = 0.99235

Ps = 2.634 × 10⁻³ slope = 0.80003  r² = 0.97886

$Ps = 1.773 \times 10^{-3}$ slope = 0.90003  $r^2 = 0.99342$ $Ps = 1.281 \times 10^{-3}$ slope = 1.0000  $r^2 = 0.99840$ $Ps = 0.937 \times 10^{-3}$ slope = 1.09995  $r^2 = 0.99949$ $Ps = 0.673 \times 10^{-3}$ slope = 1.19994  $r^2 = 0.99902$

HIGH-PERFORMANCE PLANAR SOLAR CONCENTRATORS BASED ON NANOPARTICLE DOPING

CROSS REFERENCE TO RELATED APPLICATION

The invention disclosed in the present application is related to the invention disclosed in U.S. Provisional Patent Application Ser. No. 62/332,195 filed May 5, 2016, by Wenji Dong et al. for "High-Performance Planar Solar Concentrators Based On TiO$_2$ Nanoparticle Doping" and assigned to a common assignee herewith. The disclosure of U.S. Provisional Patent Application Ser. No. 62/332,195 is incorporated herein by reference.

BACKGROUND OF THE INVENTION

Field of the Invention

The present application generally relates to light scattering-based solar concentrators (LSSCs) and, more particularly, to LSSCs using high refractive index nanoparticle (NP) dopants. An exemplary application of the LSSCs is a mobile telephone or tablet case which provides an electric charge to the mobile telephone or tablet by collecting power from the sun and providing it to the mobile telephone or tablet.

Background Description

Photovoltaic (PV) technique is a promising approach for harvesting sunlight to generate electricity required to meet the increasing global demand while minimizing environmental impact. In an effort to reduce cost and increase efficiency of PV systems, luminescence solar concentrator (LSC), one type of stationary concentration system that is capable of collecting sunlight over a large top surface and concentrating the radiation to small edges where the solar cells are attached, has been considered as a viable option. The concept of LSC is based on a transparent waveguide doped with luminescent species, by which a fraction of sunlight is converted to luminescent light. Eventually, a fraction of the luminescent light gets trapped within the waveguide due to total internal reflection (TIR) and transports towards to the edge-attached solar cells. There are several advantages of implementing LSC into PV systems. Generally, a LSC does not require expensive and complex solar tracking systems, it can harvest solar energy in both direct and diffuse conditions, and it is able to minimize use of materials of solar cells, particularly for these high-cost high-efficiency multi-junction solar cells, and thus reduce the cost of overall PV systems. More attractively, the light concentrating capability of LSCs allows the devices to output electrical power several times higher than the edge-attached solar cells under the same incident condition.

Different from assessing the performance of solar cells, which is typically described by a single parameter—the cell power conversion efficiency ($\eta_{cell}$, %), the performance of LSCs is typically assessed by two parameters. One is the device power conversion efficiency ($\eta_{SC}$, %), which means the output electrical power from the solar concentrator (P$_{SC}$, W) related to the input radiative power from sun light (P$_{in}$, W). The other is the device concentration ratio (C, dimensionless), which is the ratio between PSC and the output electrical power of the edge-attached solar cells (P$_{cell}$, W) under the same incident condition. From a practical point of view, C is a more important parameter than $\eta_{SC}$ because it directly determines the device effectiveness. The relationship between C and $\eta_{SC}$ is given below:

$$C = \frac{P_{SC}}{P_{cell}} = \frac{\eta_{SC} A_{SC} H_{in}}{\eta_{cell} A_{cell} H_{in}} = \frac{\eta_{SC}}{\eta_{cell}} \times \frac{A_{SC}}{A_{cell}} = P \times G, \quad (1)$$

where $A_{SC}$ (m$^2$) is top surface area of the device; $A_{cell}$ (m$^2$) is the area of the edge-attached solar cells; and H$_{in}$ (W·m$^2$) is the incident power density. The device optical efficiency (P, %) is defined as the ratio between $\eta_{SC}$ and $\eta_{cell}$, the device geometric gain (G, dimensionless) is defined as the ratio between A$_{SC}$ and A$_{cell}$.

In last decade, LSC research has regained its momentum and several highly efficient LSCs have been developed. Among these devices, one integrated with four GaAs solar cells has kept the current world record with $\eta_{SC}$ at 7.1% since 2008, while other reported LSCs show attractive $\eta_{SC}$ from 4.2% to 6.7%. Furthermore, by exploiting UV and NIR harvesting luminescent species, researchers have developed transparent LSCs with $\eta_{SC}$ about 0.44% and 0.40%, respectively, which provides the possibility for utilizing windows as solar energy collectors for electricity generation. Noticeably, as another type of stationary concentration system, non-luminescent solar concentrator (non-LSC) that is free of luminescent species has also been reported with an encouraging $\eta_{SC}$ at 5.6%. Its design concept is largely based on the light scattering and reflection properties of a diffuse reflector that is attached to the bottom of the device. While these developments are exciting, the enthusiasm for these devices is significantly reduced by the fact that these high-efficiency devices are practically ineffective (C≤1).

According to equation (1), to obtain a high C, a high P is preferred since G can be easily achieved by large device size. Theoretically, the maximum of P cannot exceed 70%, which means only the maximal 70% of solar energy can be concentrated by the device while the other 30% is lost primarily due to surface photon loss and material spectroscopic loss (e.g., absorption and Stokes losses). Such limitation of P leads to $\eta_{SC}$ always less than and thus for an effective (C>1) device, G should be larger than 1.43. Therefore, regardless how good $\eta_{SC}$ is, the device will be considered ineffective if its C≤1 or G<1.43. Such criteria put all these "high-efficiency" devices reported in literatures into a category of ineffective devices, which significantly limits their potential uses. The ineffectiveness of these high-efficiency LSCs is primarily due to the spectroscopic limitation of the luminescent species. The limited spectral ranges of absorption and emission directly lower P to less than 50% because of incomplete coverage of the solar spectrum and energy loss from the spectral Stokes shift, respectively. In addition, the self-absorption issue associated with the spectral overlap of the luminescent species significantly decreases P to less than 30%, especially at high G (G>2). Another concern with these studies is that $\eta_{SC}$ and C of most of these reported devices were measured in laboratories with solar simulators on devices, which cannot reflect the actual performance of these devices because there is mismatch between the solar spectrum and the spectra from solar simulators (e.g., Xe arc lamp) used in these studies. Even though the effectiveness is not a major concern for the transparent LSCs, synthetic difficulties and high production cost associated with these UV/NIR harvesting luminescent species are major barriers for their application. Moreover, P (typically P<3%) is dramatically limited by either the narrow absorption range of UV harvesting luminescent species or the large spectral overlap of NIR harvesting luminescent species. In terms of non-LSC, despite the reported high $\eta_{SC}$ that is comparable to most high-efficiency LSCs, it is also ineffective because only small G (G=1.25) can be used in the design in order to prevent the trapped light from surface photon loss caused by the uncontrolled light scattering and reflection of the diffuse reflector.

In order for current LSCs to play real roles in current PV development, significant improvements in their effectiveness are needed. One possible and promising solution is to develop novel luminescent species that have ideal spectroscopic properties. However, significant technical hurdles and potential costs to synthesize such materials as well as uncertainties of thermo-/photo-stability and environmental impact of such materials make such approach a not easy task. Even with perfect luminescent species, it is inevitable that the effectiveness of the devices will be compromised because of energy loss from the spectral Stokes shift of the luminescent species. An ideal scenario for a high-performance solar concentrator is that all photons across the solar spectrum are redirected to follow TIR within the waveguide without experiencing any spectroscopic conversion. One approach to achieving such device is to utilize nanoparticle (NP)-induced light scattering as a mechanism to manipulate light transport within the waveguide since energy loss during light scattering process is minimal compared to the spectroscopic process for single photon process.

SUMMARY OF THE INVENTION

According to the present invention, there is provided a novel light scattering-based solar concentrator (LSSC) based on high-refractive index nanoparticles (NPs). In particular, the NPs are distributed in a binder or section of a binder which is generally transparent and thermostable. The NPs are high dielectric oxide NPs with a refractive index greater than 2.0, and include $TiO_2$, ZnO, MgO, and other metal oxides, and can include mixtures of these different metal oxides. The NPs are typically in the range of 100 nm to 800 nm and more preferably in the range of 250 nm to 500 nm. Typically, the characteristics of a good binder for the solar concentrator structure include being optically transparent for light (400 nm-1100 nm) and thermal/photo radiation stable with a refractive index preferably of 1.4-1.8. Examples of suitable binders include glass, polymethylmethacrylate (PMMA) glass, polycarbonate glass, polydimethylsiloxane (PDMS) polymer, and perfluorinated polymer based optical materials. In some applications, one or more fluorescence particles may also be distributed in the binder with the NPs. In still other applications, dyes may be incorporated in the binder or in materials adjacent the LSSC.

The LSSC can be used in a wide variety of applications. For example, they can be used on the sidings of residential homes and office building, the outside tiles or windows of commercial office buildings and homes, and on cases for electronic products such as mobile telephones, tablet and portable computers, Ipods®, hand held gaming systems, automobile and hand held navigation systems, hand held ham radios, etc. In some applications the aesthetics of these materials can be improved by applying or stacking a luminescence solar concentrator (LSC) on the LSSC to form a hybrid device. Different dyes can be used in the LSC to tune, for example, the color of the sidings, tiles, or phone cases.

Based on previous studies that exploited property of light scattering within solar concentrators, we hypothesize that the number of scattered photons from different portions of the solar spectrum can be manipulated by NP size; therefore, different high-performance solar concentrators can be achieved by manipulating the light scattering within the waveguide through rationalized NP size selection, controlled NP doping and optimized device dimensions. To test this hypothesis, we chose high-refractive index $TiO_2$ NPs with different sizes as model dopants to fabricate a LSSC (other NPs such as MgO, ZnO, etc. might also be used). Our theoretical studies and outdoor experimental measurements under real-time sunny condition show that our novel devices not only exhibit high efficiency ($\eta_{SC}$=2.83~4.36%), but also have over unity concentration ratio greater than 1 (C=1.13~1.19) for the first time. Furthermore, with our novel approach we fabricated a transparent LSSC device with 81% visible transparency, which gives $\eta_{SC}$=0.86~0.95% and C=0.25~0.34. These parameters are far better than the previously reported transparent LSCs doped with UV/NIR luminescent species. More significantly, hybrid devices with the architecture of LSC stacking on LSSC demonstrate both high efficiency ($\eta_{SC}$=5.26~7.58%) and effectiveness (C=1.01~1.05). This study demonstrates the practical utility of high-performance solar concentrators and their ability to improve PV application.

BRIEF DESCRIPTION OF THE DRAWINGS

The foregoing and other objects, aspects and advantages will be better understood from the following detailed description of a preferred embodiment of the invention with reference to the drawings, in which:

FIGS. 9a to 9e are for 300 nm $TiO_2$ NPs and FIGS. 9f to 9j are for 500 nm $TiO_2$ NPs;

DETAILED DESCRIPTION OF A PREFERRED EMBODIMENT OF THE INVENTION

Figure 1:
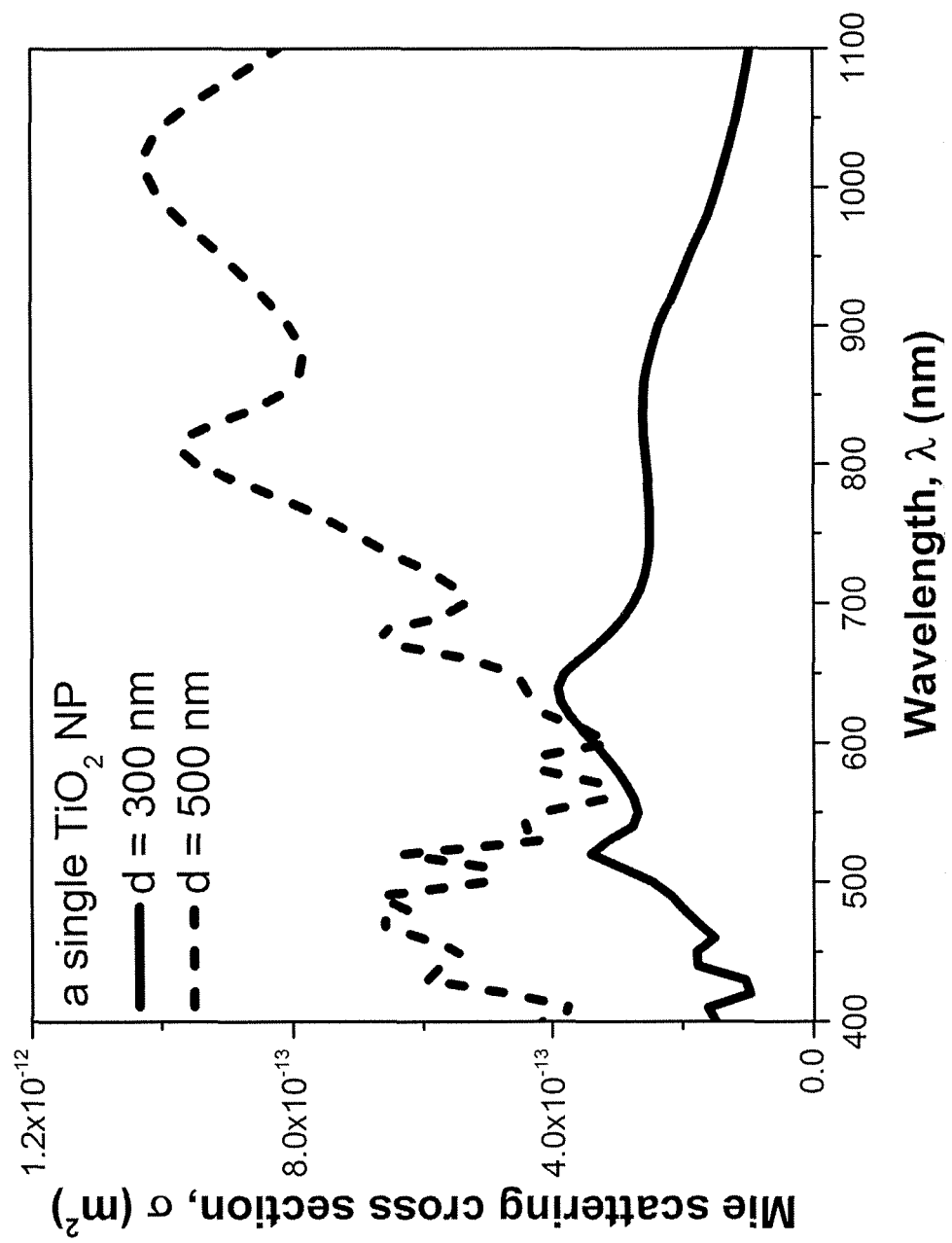
FIG. 1 is a plot of σ for single TiO2 NP with d=300 and 500 nm.

As an electromagnetic wave, the scattering of light by a homogenous spherical particle can be described by the Mie solution from solving Maxwell's equations. The light scattering capability of the single particle can be well quantified by a figure of merit, Mie scattering cross section ($\sigma$, m$^2$), which depends on the incident wavelength ($\lambda$, nm) and varies with the particle diameter (d, nm) (see examples in FIG. 1). However, in the case of ensemble particle samples with different sizes (e.g., 1 g samples of TiO$_2$ NPs with size of d=300 nm and 500 nm, respectively), it will be difficult to use $\sigma$ only compare the capabilities of scattering different regions of solar spectrum between samples. For example, although $\sigma$ at wavelength of $\lambda$=500 nm for NP of d=300 nm ($\sigma$=2.46×10$^{-13}$ m$^2$) is only about the half of that for NP of d=500 nm ($\sigma$=5.02×10$^{-13}$ m$^2$) (FIG. 1), the total light scattering capability ($\sigma_{sum}$, m$^2$) for NPs of d=300 nm in 1 g sample ($\sigma_{sum}$=4.11 m$^2$) is twice higher than that for NP of d=500 nm sample ($\sigma_{sum}$=1.81 m$^2$) due to a large particle number of d=300 nm in the sample (see Table 1).

TABLE 1

| $\sigma_{sum}$ for 1 g of TiO$_2$ NPs with d = 300 and 500 nm at $\lambda$ = 500 nm. | | |
|---|---|---|
| | d | |
| | 300 nm | 500 nm |
| $\sigma$ | 2.46 × 10$^{-13}$ m$^2$ | 5.02 × 10$^{-13}$ m$^2$ |
| Number of particles in 1 g (N$_g$) | 1.67 × 10$^{13}$ | 3.61 × 10$^{12}$ |
| $\sigma_{sum}$ ($\sigma$ × N$_g$) | 4.11 m$^2$ | 1.81 m$^2$ |

Furthermore, for the sample of NP with d=500 nm although a at wavelength $\lambda$=500 nm ($\sigma$=5.02×10$^{-13}$ m$^2$) is about the half of that at wavelength $\lambda$=950 nm ($\sigma$=9.07× 10$^{-13}$ m$^2$), total $\sigma_{sum}$ of the sample at $\lambda$=500 nm ($\sigma_{sum}$=1.95×106 m$^2$) is threefold higher than that at $\lambda$=950 nm ($\sigma_{sum}$=6.37×105 m$^2$) because the solar spectrum provides more photon at $\lambda$=500 nm than that at $\lambda$=950 nm (see Table 2).

TABLE 2

| $\sigma_{sum}$ for TiO$_2$ NPs with d = 500 nm at $\lambda$ = 500 nm and 950 nm. | | |
|---|---|---|
| | $\lambda$ | |
| | 500 nm | 950 nm |
| $\sigma$ | 5.02 × 10$^{-13}$ m$^2$ | 9.07 × 10$^{-13}$ m$^2$ |
| Number of photons in AM1.5G solar spectrum (N$_p$) | 3.88 × 10$^{18}$ | 7.03 × 10$^{17}$ |
| $\sigma_{sum}$ ($\sigma$ × N$_p$) | 1.95 × 10$^6$ m$^2$ | 6.37 × 10$^5$ m$^2$ |

Figure 2:
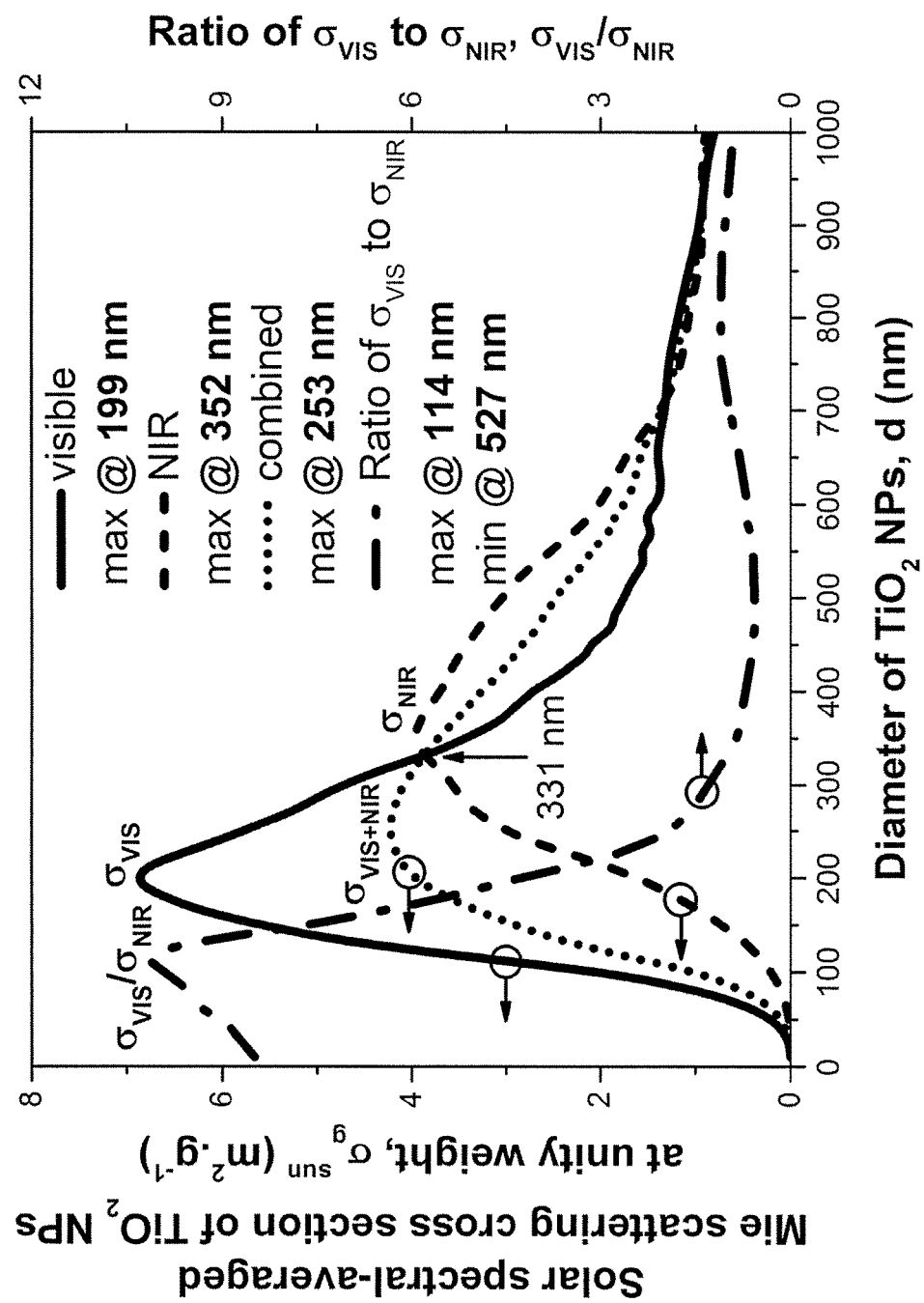
FIG. 2 is a plot of $\sigma_g^{sun}$ ($\sigma_{VIS}$, $\sigma_{NIR}$ and $\sigma_{VIS+NIR}$) as function of NP size d.

With these considerations when applying $\sigma$ to describing the total light scattering capability of ensemble NP sample (1 g of TiO$_2$ NPs) for the entire solar spectrum, we here define $\sigma_g^{sun}$ (m$^2$·g$^{-1}$) as spectrally-averaged Mie scattering cross section of TiO$_2$ NPs at unit weight. It is noted that $\sigma_g^{sun}$ is only a function of d because the condition of sunlight (defined as solar spectrally-averaged $\sigma$–$\sigma^{sun}$, m$^2$) and the number of the particles (defined as particle numbers of TiO$_2$ NPs at unit weight—N$_g$, g$^{-1}$) have already been counted in:

$$\sigma_g^{sun}(d) = \sigma^{sun} \times N_g = \frac{\int_{\lambda_{min}}^{\lambda_{max}} \phi_{sun}(\lambda)\sigma(\lambda d)d\lambda}{\int_{\lambda_{min}}^{\lambda_{max}} \phi_{sun}(\lambda)d\lambda} \times \frac{1}{\rho\frac{4}{3}\pi\left(\frac{d}{2}\right)^3}, \quad (2)$$

where $\lambda_{min}$ (nm) and $\lambda_{max}$ (nm) indicates the wavelength region of interest; $\phi_{sun}(\lambda)$ (m$^{-2}$·s$^{-1}$) is photon distribution of AM1.5G solar spectrum; $\sigma$ is calculated from the online Mie theory calculator for TiO$_2$ NPs in PMMA medium (RI=1.49); and $\rho$ (g·cm$^{-3}$) is the density of the TiO$_2$ NPs ($\rho$=4.23 g·cm$^{-3}$). The plot of $\sigma_g^{sun}$ as function of d includes three different plots as depicted in FIG. 2. They are $\sigma_{VIS}$ for visible range (400~700 nm), $\sigma_{NIR}$ for near-infrared range (700~1100 nm) and $\sigma_{VIS+NIR}$ for combined range (400~1100 nm). The plot that indicates the ratio between $\sigma_{VIS}$ and $\sigma_{NIR}$ ($\sigma_{VIS}/\sigma_{NIR}$) is also presented.

Figure 3:
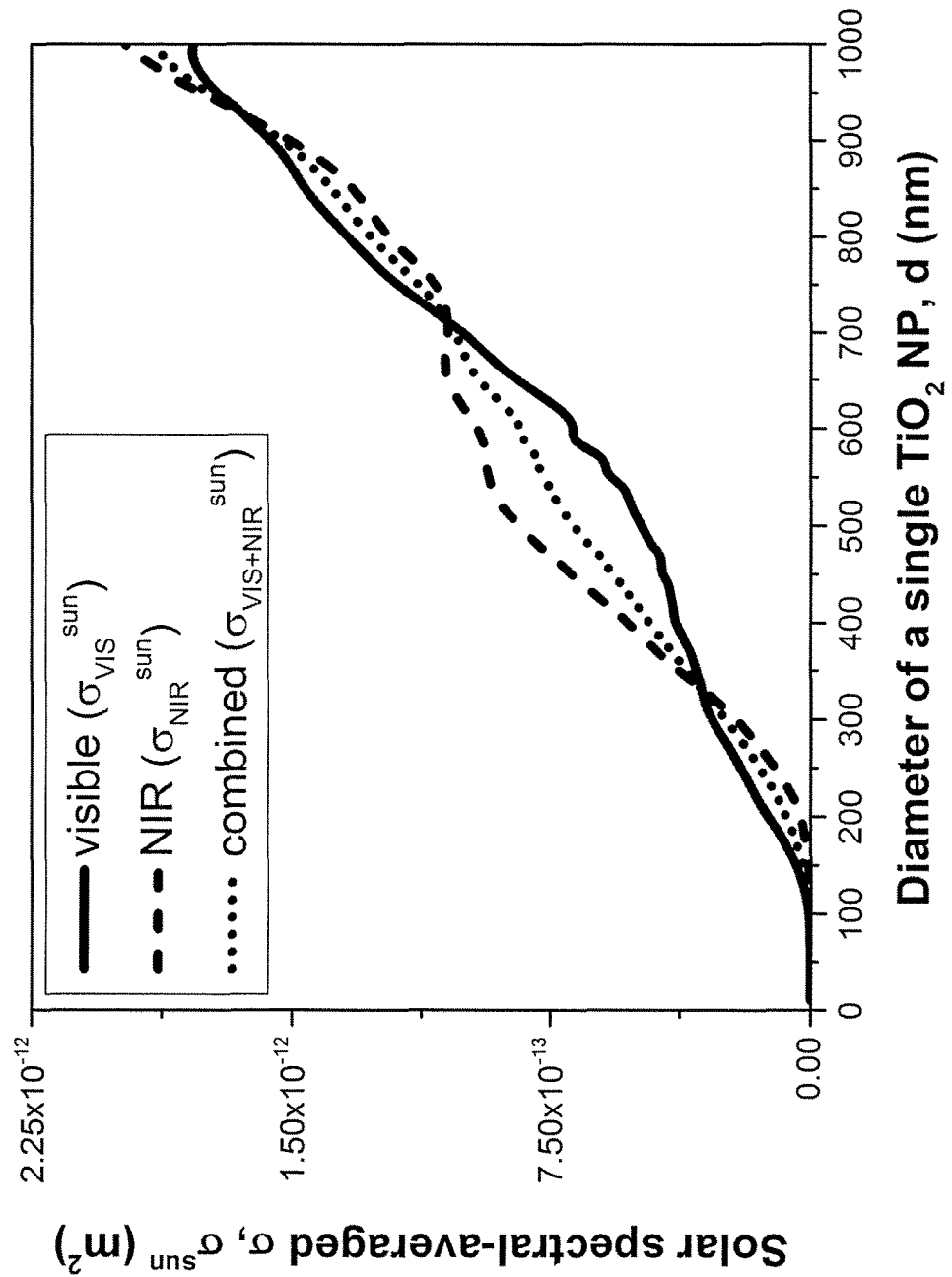
FIG. 3 is a plot of $\sigma^{sun}$ and Ng as functions of d.
Figure 4:
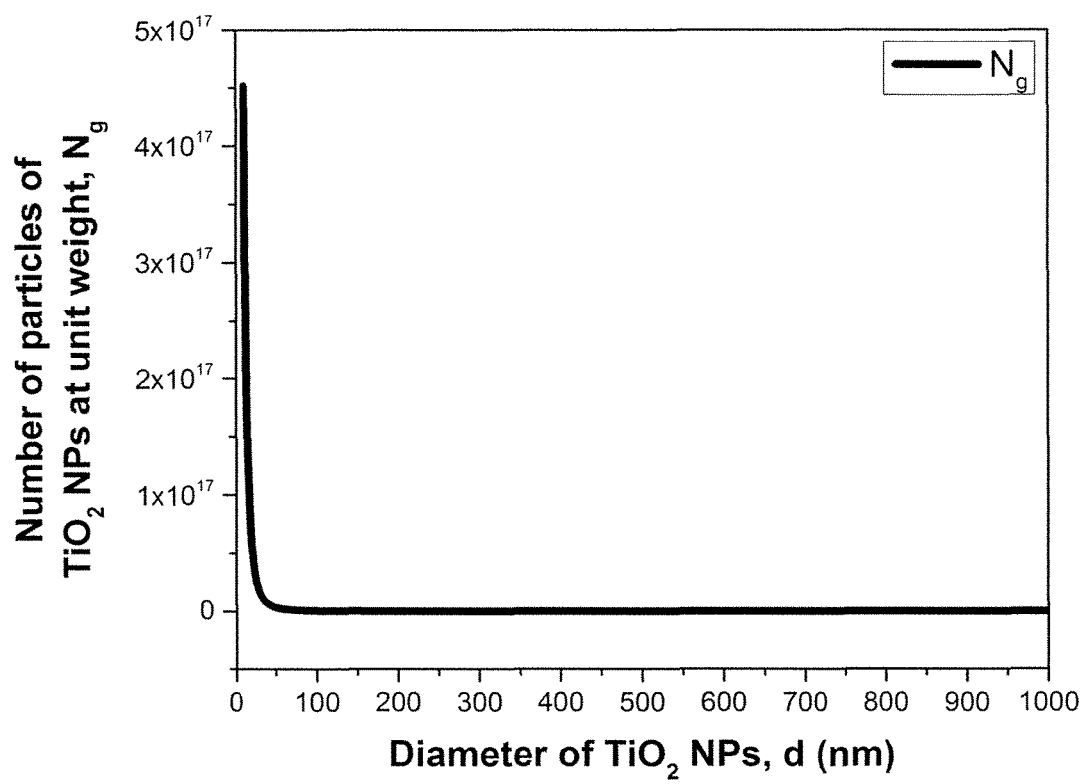
FIG. 4 is a plot of $\sigma^{sun}$ as a function of d.

It is noted in FIG. 2 that all curves of $\sigma_g^{sun}$ follow bell-shaped pattern because as defined in equation (2), the term $\sigma^{sun}$ increases with d, similar to the behavior of $\sigma$ (single large particle typically has stronger light scattering capability than single small particle) (FIG. 3) while N$_g$ rapidly decreases with d, exhibiting a reciprocal cubic function (FIG. 4). The maximum points for $\sigma_{VIS}$, $\sigma_{NIR}$ and $\sigma_{VIS+NIR}$ are at d=159, 352 and 253 nm, which are the optimal sizes of TiO$_2$ NPs for scattering visible, near-infrared and combined light, respectively. Furthermore, d=331 nm is the intersection between $\sigma_{VIS}$ and $\sigma_{NIR}$, which is the critical diameter of TiO$_2$ NPs in terms of optimally scattering both visible and near-infrared light. When d<331 nm, TiO$_2$ NPs exhibit stronger light scattering capability towards visible light than near-infrared light and vice versa when d>331 nm. Finally, $\sigma_{VIS}/\sigma_{NIR}$ represents the light scattering capability of TiO$_2$ NPs towards visible light with respect to near-infrared light. At d=114 nm, $\sigma_{VIS}$ is 10 times higher than $\sigma_{NIR}$ while at d=527 nm, $\sigma_{NIR}$ is twice higher as $\sigma_{VIS}$. Results shown in FIG. 2 provide the rationale and guidance for this study for the size selection of TiO$_2$ NPs to construct different LSSCs for harvesting different regions of solar photons with using the minimum amount of TiO$_2$ NPs. Several design concepts of LSSCs can be established according to the plot of $\sigma_{VIS+NIR}$. For example, 253 nm TiO$_2$ NP can be selected to fabricate general LSSC because both visible and near-infrared light can be efficiently scattered. To fabricate transparent LSSC, 527 nm TiO$_2$ NP can be used because it preferably scatters near-infrared light with minimal scattering of visible light. To prove these concept designs, we choose commercial 300 nm and 500 nm TiO$_2$ NPs for general and transparent LSSC fabrications, respectively.

Figure 5:
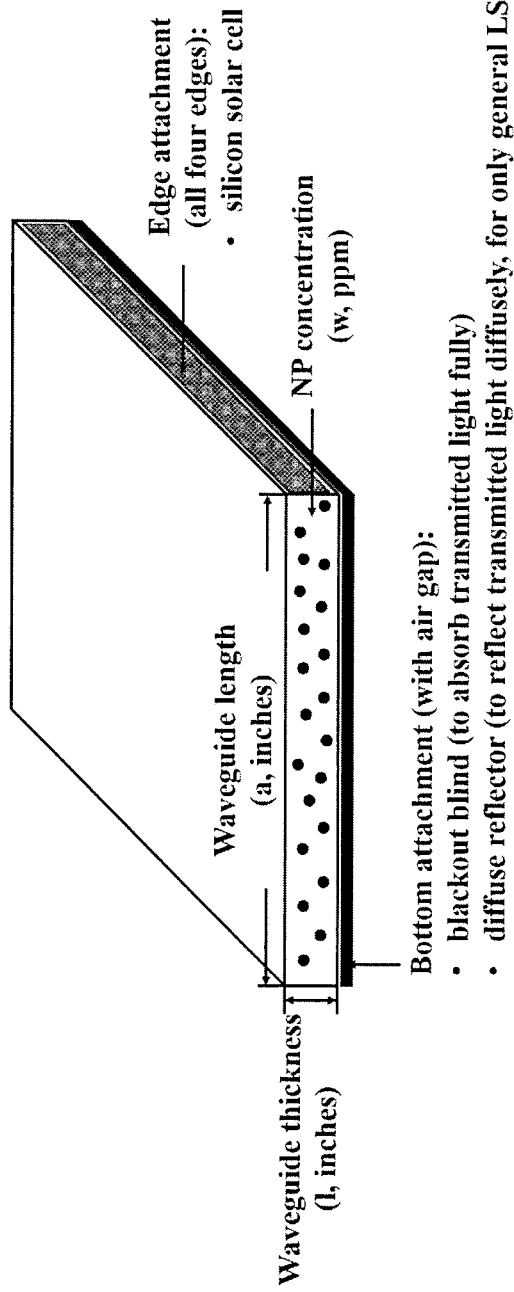
FIG. 5 is a schematic representation of a LSSC according to an embodiment of the invention.

The study of general LSSC doped with 300 nm TiO$_2$ NPs focused on investigating the effects of NP concentration (w, ppm) and waveguide dimensions including length (a, inch) and thickness (1, inch) on $\eta_{SC}$. During the experiments, either a blackout blind or a diffuse reflector was used to attach to the bottom of the device (see schematic representation in FIG. 5). A blackout blind makes the device subjected to both top and bottom surface photon loss while a diffuse reflector allows only top surface photon loss.

Figure 6:
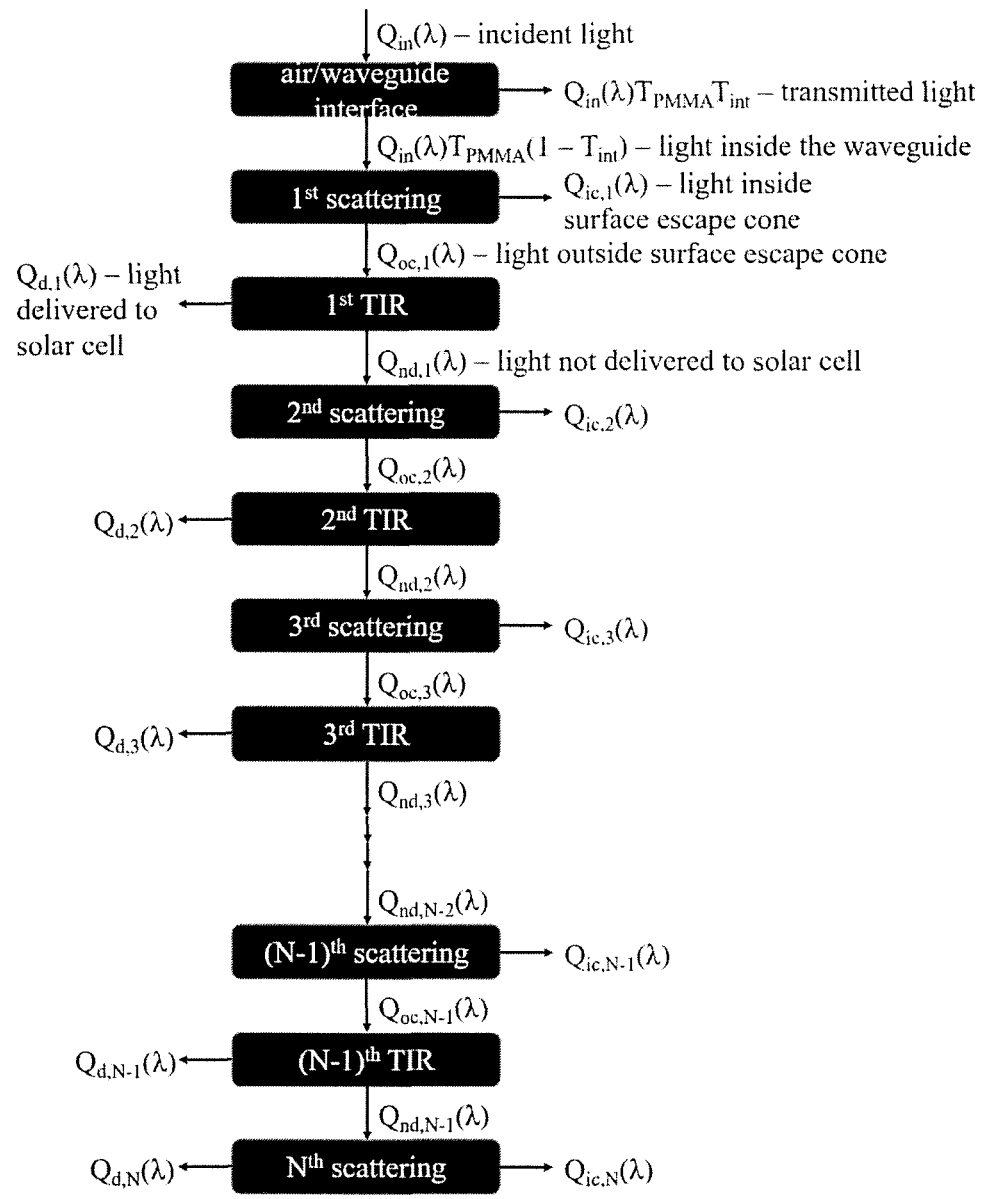
FIG. 6 is a flow diagram of photo flow in the system of LSSC with blackout blind.

In addition, a theoretical model (derived in FIG. 6 and FIG. 7) was proposed to fit the experimental data and make predications. FIG. 6 is a flow diagram in the system of LSSC with a blackout blind. According to the flow diagram of FIG. 6, the expressions of $Q_{d,N}(\lambda)$, $Q_{d,N-1}(\lambda)$ and $Q_{d,1}(\lambda)$ can be derived as:

$$\begin{cases} Q_{d,N}(\lambda) = Q_{nd,N-1}(\lambda)(1-F) = Q_{oc,N-1}(\lambda)(1-F)(1-T_{int}^k) \\ Q_{d,N-1}(\lambda) = Q_{oc,N-1}(\lambda)T_{int}^k = Q_{nd,N-2}(\lambda)(1-F)T_{int}^k = \\ \qquad Q_{d,N-2}(\lambda)(1-F)(1-T_{int}^k) \\ Q_{d,1}(\lambda) = Q_{oc,N-1}(\lambda)T_{int}^k \end{cases} \Rightarrow$$

$$\begin{cases} Q_{d,N}(\lambda) = Q_{d,N-1}(\lambda)\dfrac{(1-F)(1-T_{int}^k)}{T_{int}^k} \\ Q_{d,N-1}(\lambda) = Q_{d,1}(\lambda)(1-F)^{N-2}(1-T_{int}^k)^{N-2} \\ Q_{d,1}(\lambda) = Q_{in}(\lambda)T_{PMMA}(1-T_{int})(1-F)T_{int}^k \end{cases}$$

The total photo flow that is delivered to the solar cell is $$Q_d(\lambda) = Q_{d,1}(\lambda) + Q_{d,2}(\lambda) + Q_{d,3}(\lambda) + \ldots + Q_{d,N-1}(\lambda) + Q_{d,N}(\lambda)$$

Substitute the expressions of $Q_{d,N}(\lambda)$, $Q_{d,N-1}(\lambda)$ and $Q_{d,1}(\lambda)$ into the above expression, calculate the sum of a geometric sequence and rearrange the equation can yield:

$$Q_d(\lambda) = Q_{in}(\lambda)A \text{ with } A = T_{PMMA}(1-T_{int})\left[\dfrac{(1-F)T_{int}^k + F(1-F)^N(1-T_{int}^k)^N}{1-(1-F)(1-T_{int}^k)}\right]$$

Figure 7:
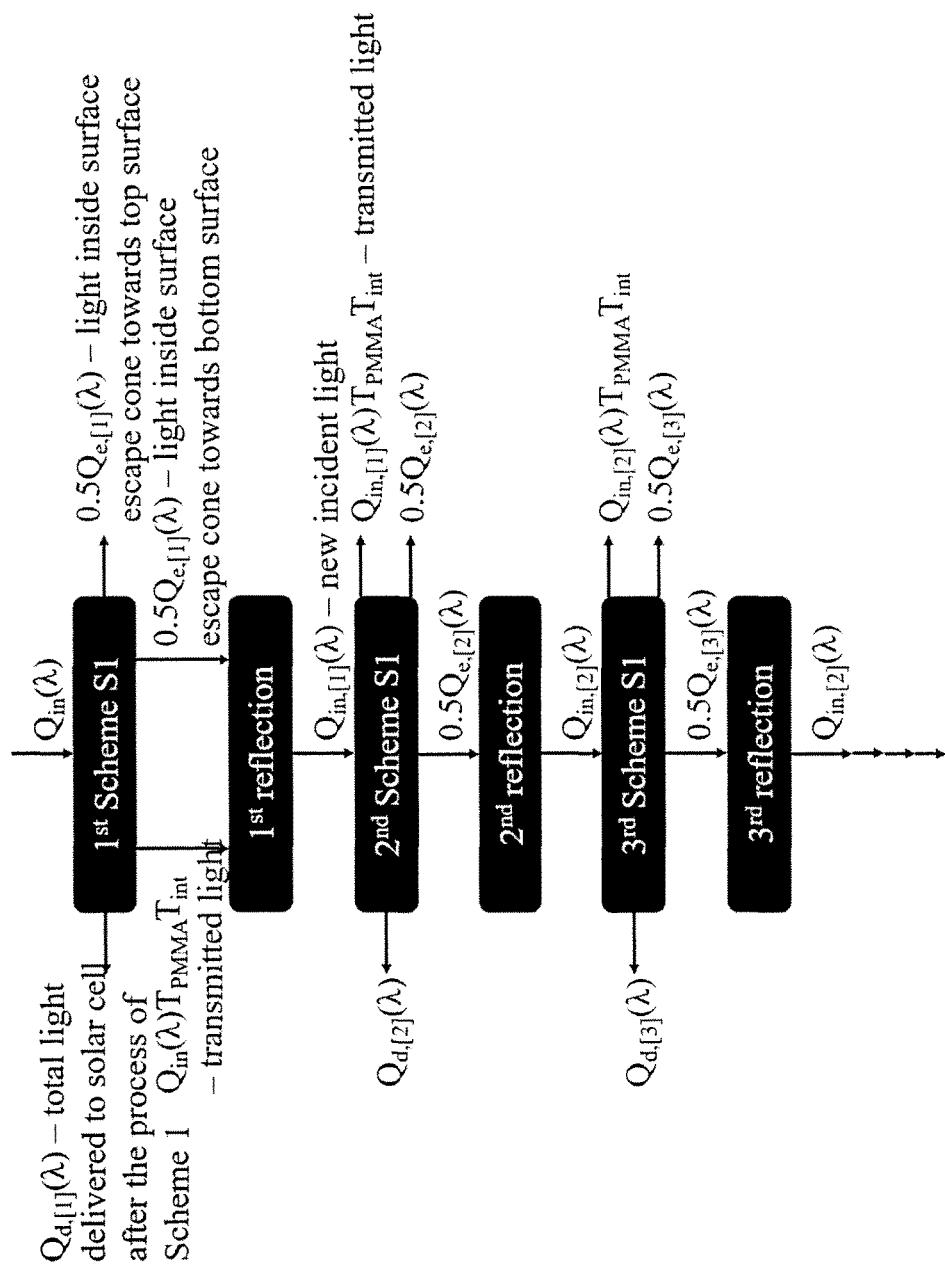
FIG. 7 is a flow diagram of photo flow in the system of LSSC with diffuse reflector.

FIG. 7 is a photo flow diagram in the system of LSSC with a diffuse reflector. The total photo flow that is delivered to the solar cell is $$Q_d(\lambda) = Q_{d,[1]}(\lambda) + Q_{d,[2]}(\lambda) + Q_{d,[3]}(\lambda) + \ldots$$

The expression of $Q_{in,[1]}(\lambda)$ is:

$$Q_{in,[1]}(\lambda) = Q_{in}(\lambda)T_{PMMA}T_{int} + 0.5Q_{e,[1]}(\lambda) \Rightarrow Q_{in,[1]}(\lambda) =$$
$$Q_{in}(\lambda)T_{PMMA}T_{int} + 0.5[Q_{in}(\lambda)T_{PMMA}(1-T_{int}) - Q_{d,[1]}(\lambda)] \Rightarrow Q_{in,[1]}(\lambda) =$$
$$Q_{in}(\lambda)T_{PMMA}T_{int} + 0.5[Q_{in}(\lambda)T_{PMMA}(1-T_{int}) - Q_{in}(\lambda)A] \Rightarrow$$
$$Q_{in,[1]}(\lambda) =$$
$$Q_{in}(\lambda)T_{PMMA}T_{int} + Q_{in}(\lambda)\dfrac{B}{2} \text{ with } B = T_{PMMA}(1-T_{int}) - A$$

The expression of $Q_{in,[2]}(\lambda)$ is:

$$Q_{in,[2]}(\lambda) = 0.5Q_{e,[2]}(\lambda) = Q_{in,[1]}(\lambda)\dfrac{B}{2} = Q_{in}(\lambda)T_{PMMA}T_{int}\dfrac{B}{2} + Q_{in}(\lambda)\left(\dfrac{B}{2}\right)^2$$

Substitute the expression of $Q_{in,[1]}(\lambda)$, $Q_{in,[2]}(\lambda)$ and ... into the expression of $Q_d(\lambda)$ can yield:

$$Q_d(\lambda) = Q_{in}(\lambda)A + \left[Q_{in}(\lambda)T_{PMMA}T_{int} + Q_{in}(\lambda)\dfrac{B}{2}\right]$$

$$A + \left[Q_{in}(\lambda)T_{PMMA}T_{int}\dfrac{B}{2} + Q_{in}(\lambda)\left(\dfrac{B}{2}\right)^2\right]A + \ldots$$

Simplified the above expression can finally yield:

$$Q_d(\lambda) = Q_{in}(\lambda)A(1 + T_{PMMA}T_{int})\dfrac{1}{1-\dfrac{B}{2}} \text{ with } B = T_{PMMA}(1-T_{int}) - A$$

Figure 8A:
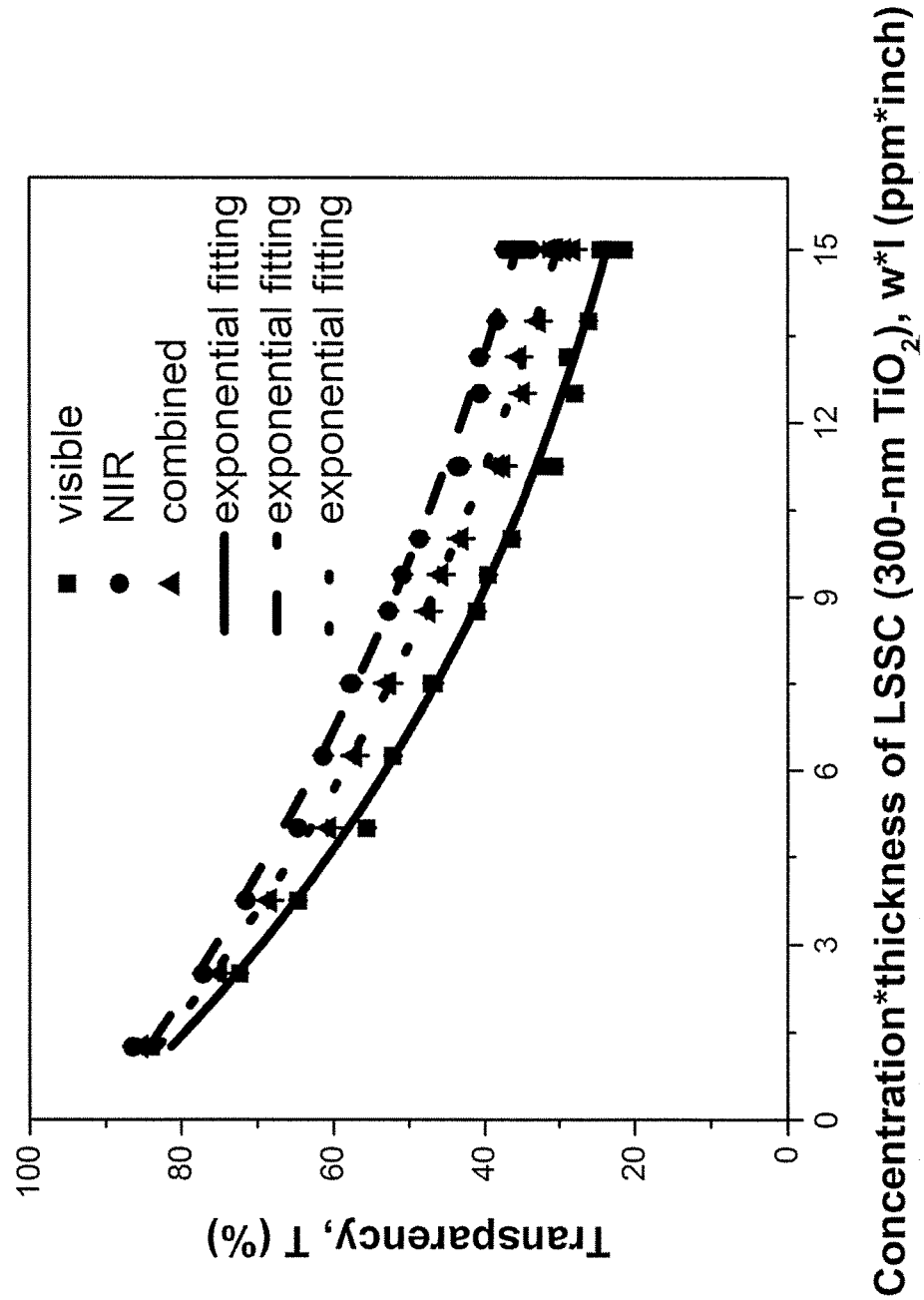
FIGS. 8a and 8b are plots showing exponential fitting of transparence data of LSSCs.
Figure 8B:
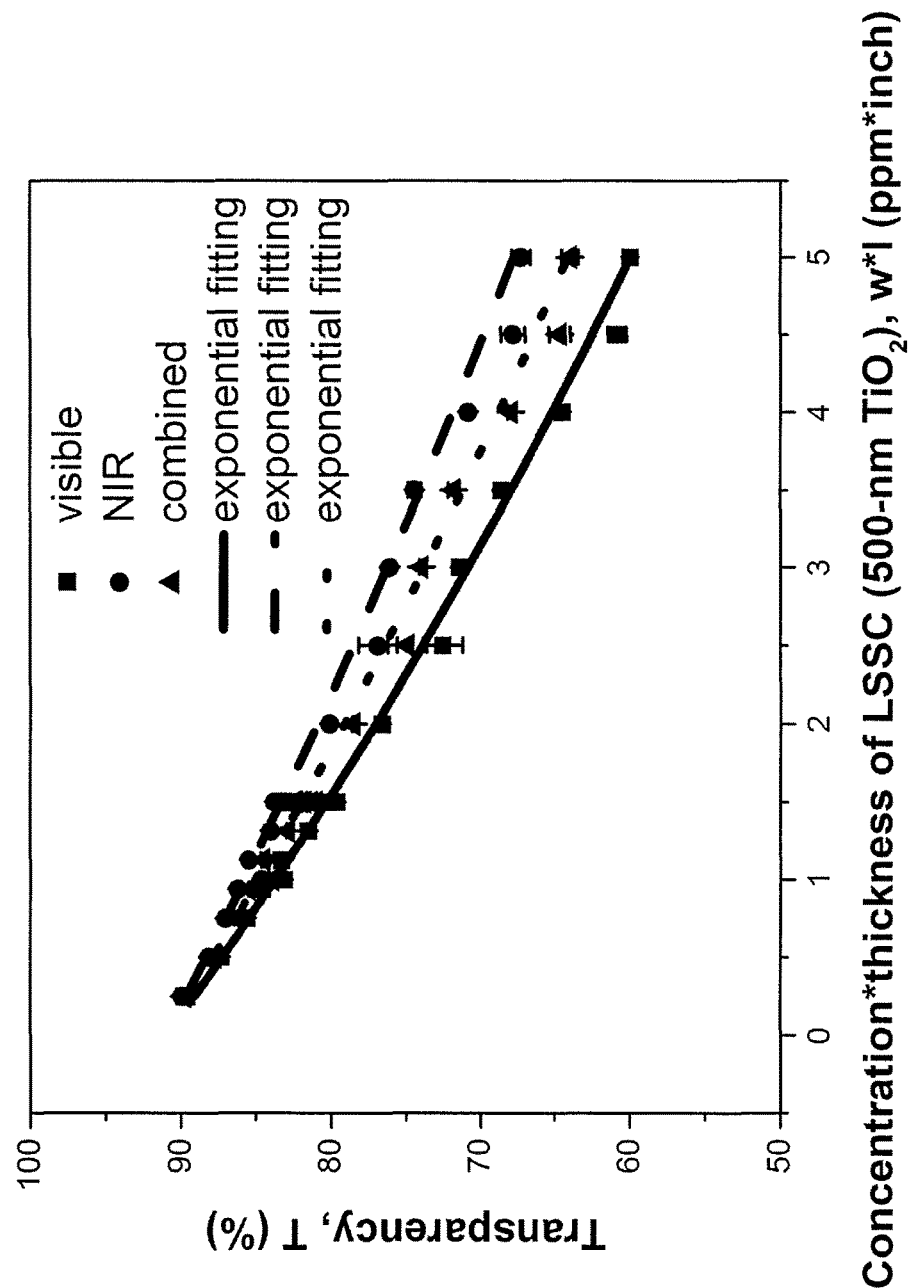

According to equation (1), $\eta_{SC}$ is the product of $\eta_{cell}$ and P. The former is 15% for the solar cells used in our experiments and the latter can be calculated by the following equations:

$$P = \begin{cases} A & (w/\text{blackout blind}) \\ A(1 + T_{PMMA}T_{int})\dfrac{1}{1-\dfrac{B}{2}} & (w/\text{diffuse reflector}) \end{cases} \quad (3)$$

$$\text{with} \begin{cases} A = T_{PMMA}(1-T_{int})\dfrac{(1-F)T_{int}^k + F(1-F)^N(1-T_{int}^k)^N}{F + (1-F)T_{int}^k}, \\ B = T_{PMMA}(1-T_{int}) - A \end{cases}$$

where TPMMA (%) is the transparency of PMMA (TPMMA=91%); Tint (%) is the internal transparency of the waveguide excluding PMMA; F (%) is the theoretical fraction of the scattered light that is not trapped by TIR within the waveguide; k (dimensionless) is the photon transport length coefficient; and N (dimensionless) is the number of scattering along the photon transport length (notated by k·l, m). The calculation methods of T, F, k and N are given as follow:

$$\begin{cases} T_{int} = 10^{-\varepsilon w l} \\ F = 1 - \sqrt{1 - \dfrac{1}{n^z}} \\ k = 0.19205 + 1.67143 G_{adj} \\ N = Ps\dfrac{kl}{z} \end{cases} \text{with} \begin{cases} G_{adj} = \dfrac{2G}{\sqrt{\pi}} \\ z = \left[\rho\dfrac{4}{3}\pi\left(\dfrac{d}{z}\right)^3\middle/\rho_{PMMA}w\right]^{\frac{1}{5}} \end{cases} \quad (4)$$

where $\varepsilon$ (ppm$^{-1}$·in$^{-1}$) is the absorption coefficient of TiO$_2$ NPs in the waveguide from 400 nm to 1100 nm ($\varepsilon$=0.3188 ppm$^{-1}$ in$^{-1}$, determined experimentally in FIGS. 8a, 8b and Table 3); $G_{adj}$ is the adjusted geometric gain of the device, which converts a square geometry into a circle geometry without changing the thickness and volume of the waveguide; Ps (dimensionless) is the particle scattering fraction, indicating the fraction of the linear-aligned TiO$_2$ NPs that performs light scattering (Ps=1.123×10$^{-3}$, optimized in FIG. 9c, Ps=1.281×10$^{-3}$, optimized in FIG. 9h)); z (m) is the distance between the TiO$_2$ NPs in the waveguide; and $\rho$PMMA (g·m$^{-3}$) is the density of PMMA ($\rho_{PMMA}$=1.2 g·cm$^{-3}$).

TABLE 3

ε obtained from the exponential fitting results.

|  | λ region of interest | | |
| --- | --- | --- | --- |
|  | VIS (400-700 nm) | NIR (700-1100 nm) | VIS + NIR (400-1100 nm) |
| $\varepsilon_{300\,nm}$ (ppm$^{-1}$·in$^{-1}$) | 0.03900 | 0.02706 | 0.03188 |
| $\varepsilon_{500\,nm}$ (ppm$^{-1}$·in$^{-1}$) | 0.03627 | 0.02561 | 0.03044 |

Figure 9A:
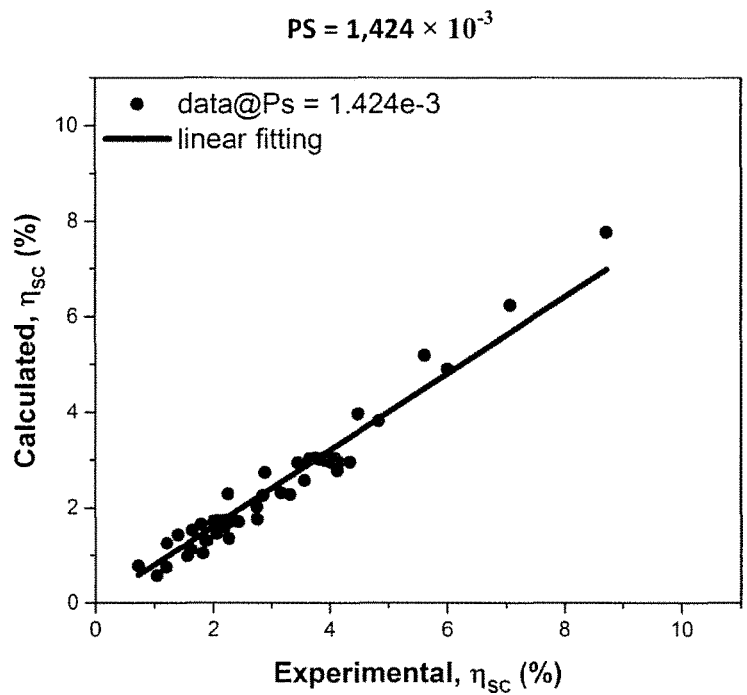
FIGS. 9a to 9i are plots showing optimization of Ps (x-axis: experimental $\eta_{SC}$; y-axis: calculated $\eta_{SC}$) where
Figure 9B:
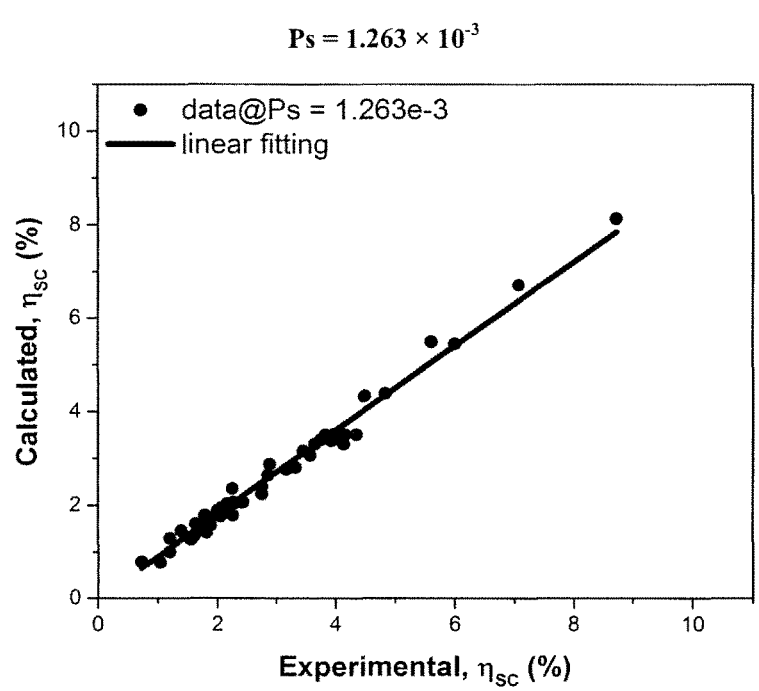
Figure 9C:
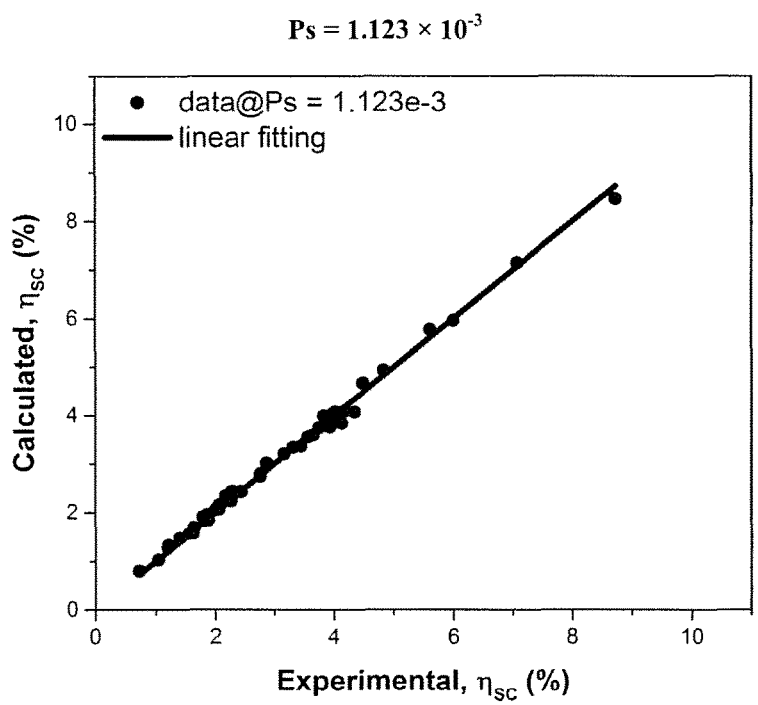

It should be noted that whereas FIGS. 9a to 9c are for the cases for 300 nm TiO$_2$ NPs and FIGS. 9f to 9j are for the cases for 500 nm TiO$_2$ NPs, we began our study with 100 nm TiO$_2$ NPs. Even though 250 nm TiO$_2$ NPs give the best results, 100 nm TiO$_2$ NPs did work also. Recent simulation suggests that larger size of particles (such as 800 nm) will work better in harvesting near-IR solar light. 500 nm TiO$_2$ NPs were used in our study only because there was no commercially available 800 nm TiO$_2$ NPs at the time of our study. In the practice of the invention, the TiO$_2$ NPs may be 100 to 800 nm, or more preferably 250-500 nm.

Figure 10A:
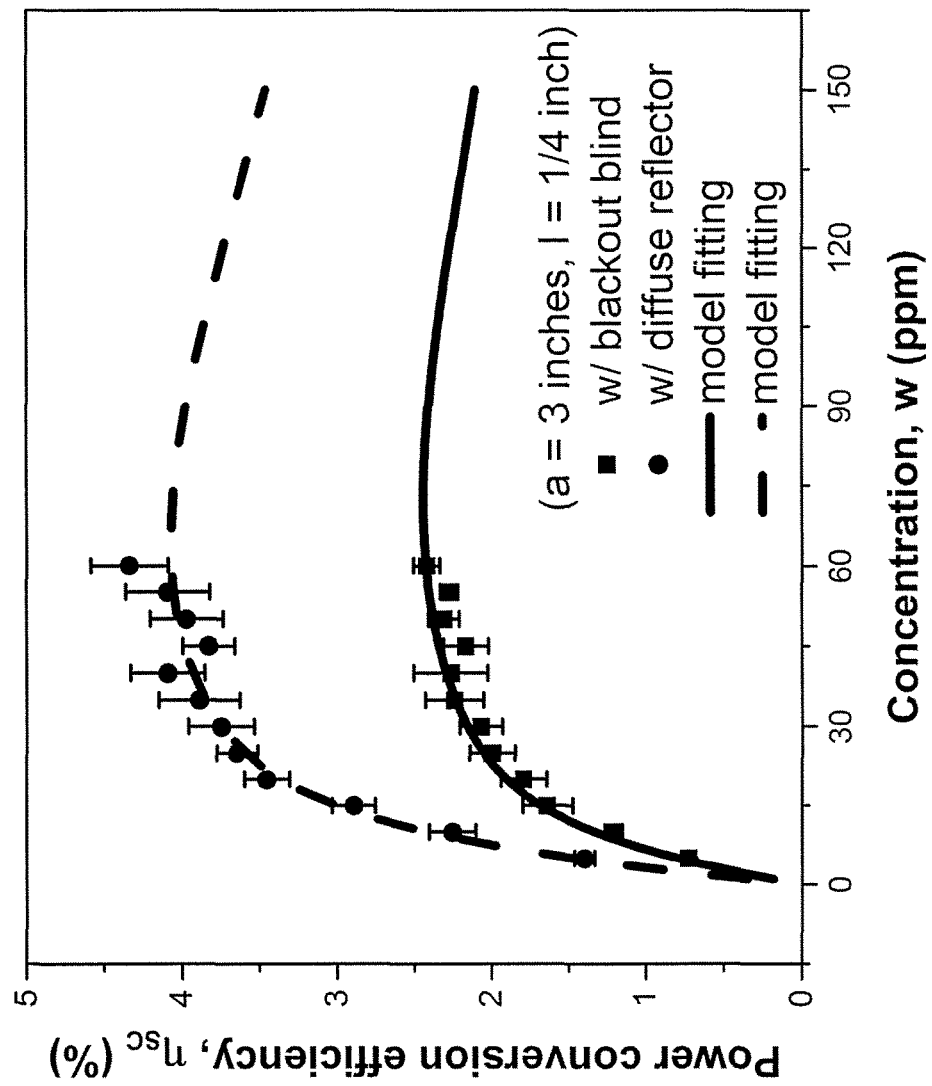
FIG. 10a is a plot that depicts the $\eta_{SC}$ obtained from the concentration-dependent measurement.

FIG. 10a depicts the $\eta_{SC}$ obtained from the concentration-dependent measurement and the corresponding model fitting results. Unlike LSCs (G>2) where the diffuse reflector has less contribution to $\eta_{SC}$ than the luminescent species, the use of a diffuse reflector in a LSSC nearly doubles its $\eta_{SC}$ because the TiO$_2$ NPs scatter light across the entire solar spectrum and thus allow the device to collect the bottom-reflected light. It is interesting to see that regardless a blackout blind or a diffuse reflector is used, the $\eta_{SC}$ increases sharply below 30 ppm followed by a gradual increase until 60 ppm. Such observation can be attributed to the consequential effect of two competitive factors—scattering-induced surface photon loss and TIR-induced edge photon delivery, both of them are associated with the light scattering capability of device or, more directly, the NP concentration. At low concentration (w≤30 ppm), the TIR-induced edge photon delivery is a dominated process, which is enhanced with w. At relatively high concentration (30 ppm<w≤60 ppm), the scattering-induced surface photon loss starts to compete with the TIR-induced edge photon delivery, which is caused by the increase of N (defined in equation (4)). The compromise between the two factors results in the slow increase of $\eta_{SC}$. From the perspective of the model fitting results, it supports the two-phase change of $\eta_{SC}$ and further predicts a third phase where $\eta_{SC}$ starts to decrease at w>60 ppm, indicating that the TIR-induced edge photon delivery is suppressed by the scattering-induced surface photon loss.

Figure 9D:
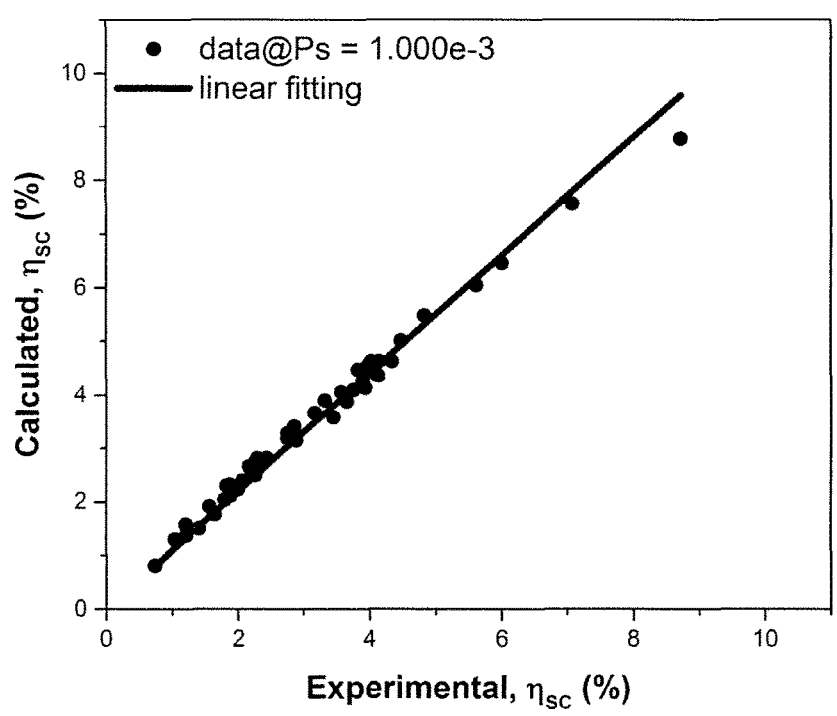
Figure 9E:
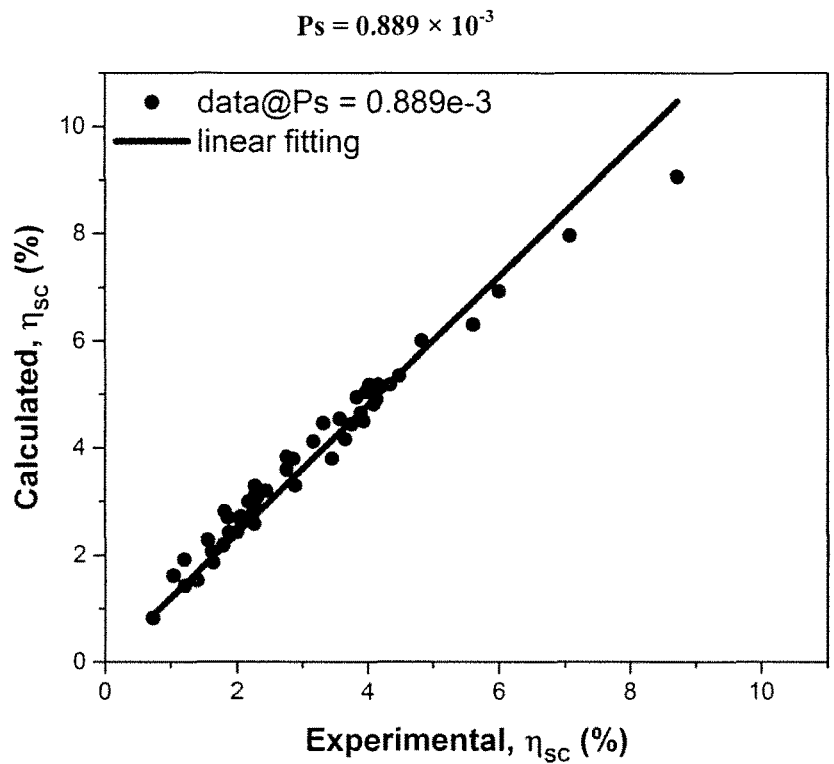
Figure 9F:
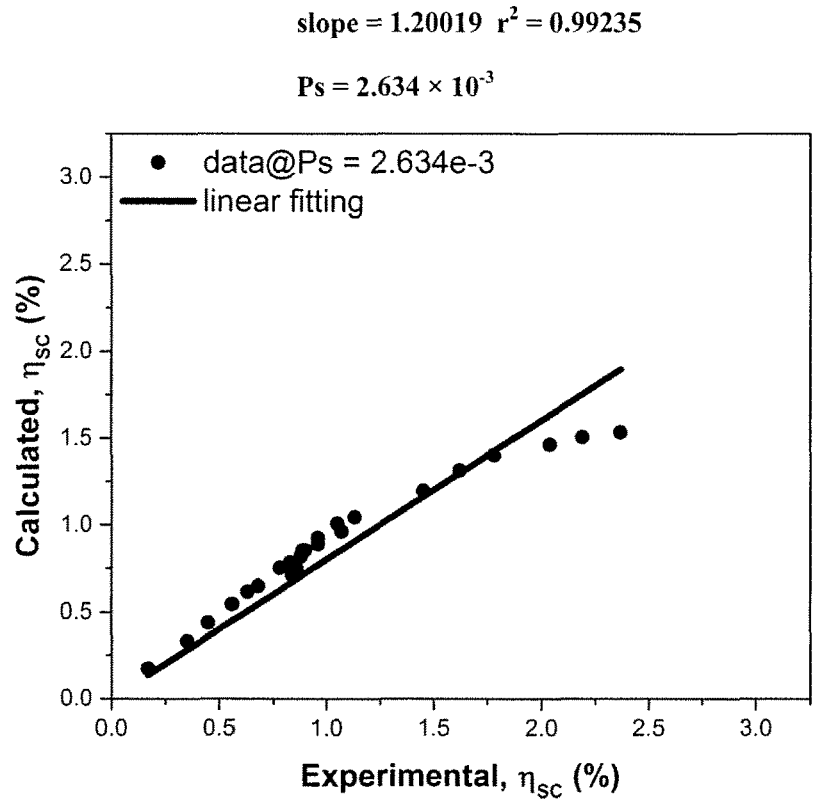
Figure 9G:
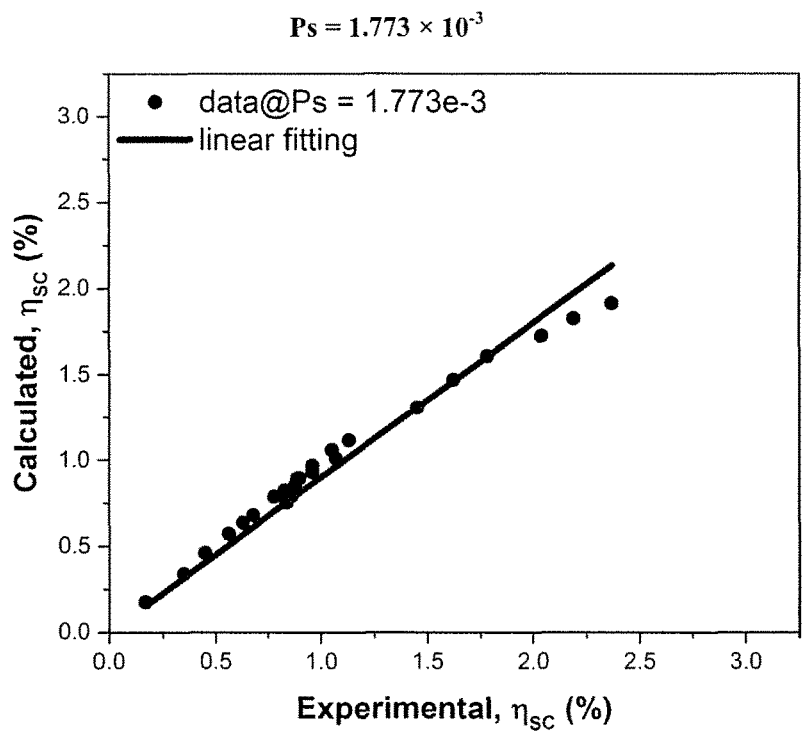
Figure 10B:
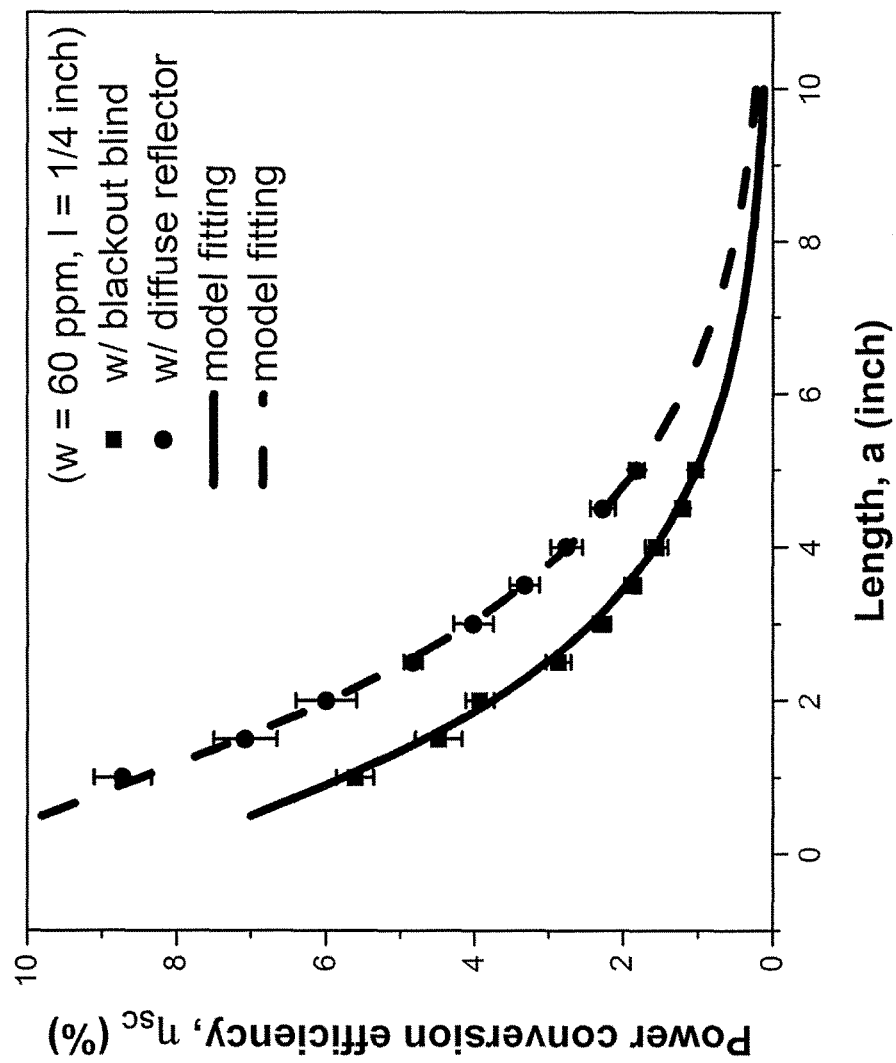
FIGS. 10b and 10c are plots that show the effect of waveguide length and thickness on $\eta_{SC}$, respectively.
Figure 10C:
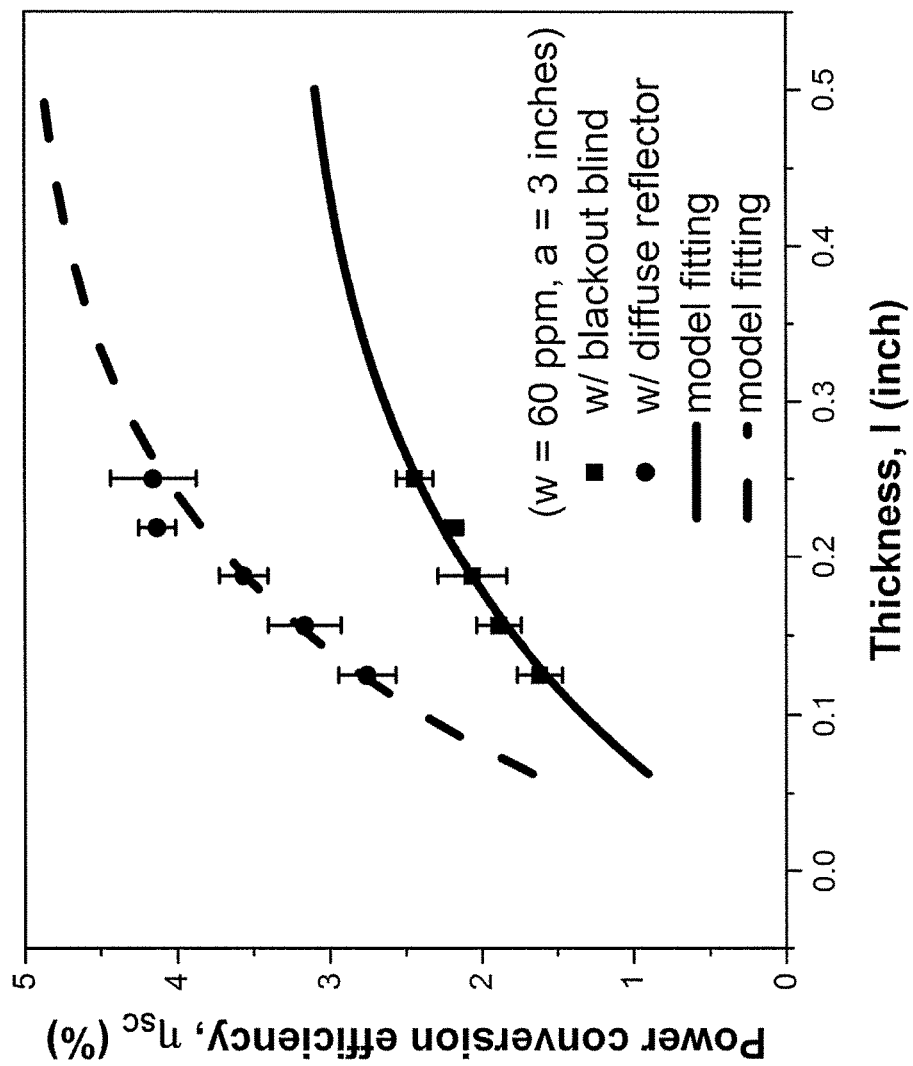
Figure 10D:
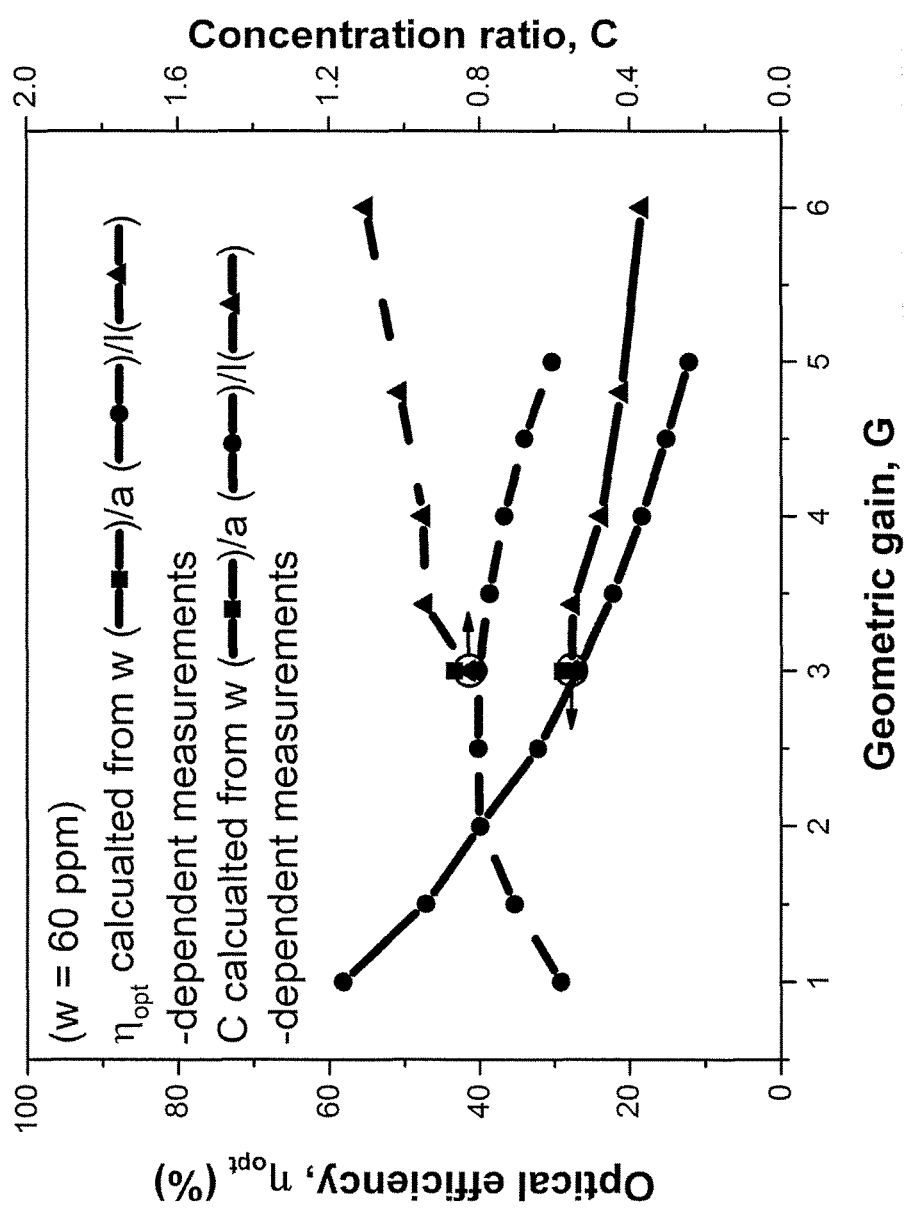
FIG. 10d is a plot that summaries all the experimental results at w=60 ppm.

FIG. 10b and FIG. 10c show the effect of waveguide length and thickness on $\eta_{SC}$, respectively. Different from the change of $\eta_{SC}$ in concentration-dependent measurement, $\eta_{SC}$ decreases with the waveguide length and increases with the waveguide thickness, implying that a large waveguide length accelerates the scattering-induced surface photon loss while a large waveguide thickness promotes the TIR-induced edge photon delivery. The model curves provide good fitting results with the experimental data, suggesting a fast quasi-exponential decay and a slow quasi-logarithmic increase of $\eta_{SC}$ with the waveguide length and thickness, respectively. Because G is defined with the waveguide geometry ($\sigma=a/4\cdot l$), there is no doubt that increase G will adversely affect $\eta_{SC}$. Conclusively, a large G in the LSSC promotes scattering-induced surface photon loss and impedes the TIR-induced edge photon delivery, which is similar to LSCs. FIG. 9d summaries all the experimental results at w=60 ppm showing the effect of G on P and C. It is noted that P decreases with G while the effect of G on C seems complicated. In the length-dependent measurement, C performs a two-phase change (increase then decrease) maximized at G=3, while in the thickness-dependent measurement, C increases at G=3~6. The overall trends observed from G-P and G-C relationships suggest that there is a trade-off between P and C, which is intrinsically caused by the competition between scattering-induced surface photon loss and TIR-induced edge photon delivery. Such conclusion is consistent with the results reported for glass-based diffuse type solar concentrators. C of these devices ranges from 0.58 to 1.10, which is above the average of the reported high-efficiency LSCs (C=0.54). Particularly, two devices demonstrate relatively high efficiency and effectiveness ($\eta_{SC}$=2.76%, C=1.10 and $\eta_{SC}$=3.17%, C=1.01).

The study of transparent LSSC doped with 500 nm TiO$_2$ NPs is similar to that of the general LSSC. In the $\eta_{SC}$ measurement, bottom-attached blackout blind was used to ensure the full absorption of the transmitted light, mimicking the scenario of light passing through a transparent substance. In addition, the transmission spectrum of the waveguide in each device was measured and the corresponding visible transparency (T$_{VIS}$, %) was calculated.

Figure 9H:
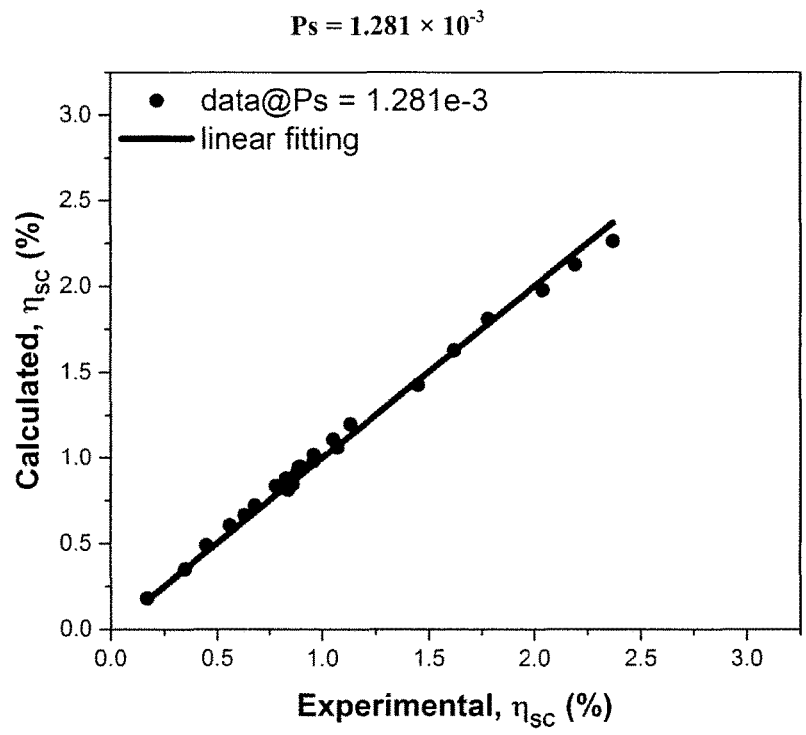
Figure 9I:
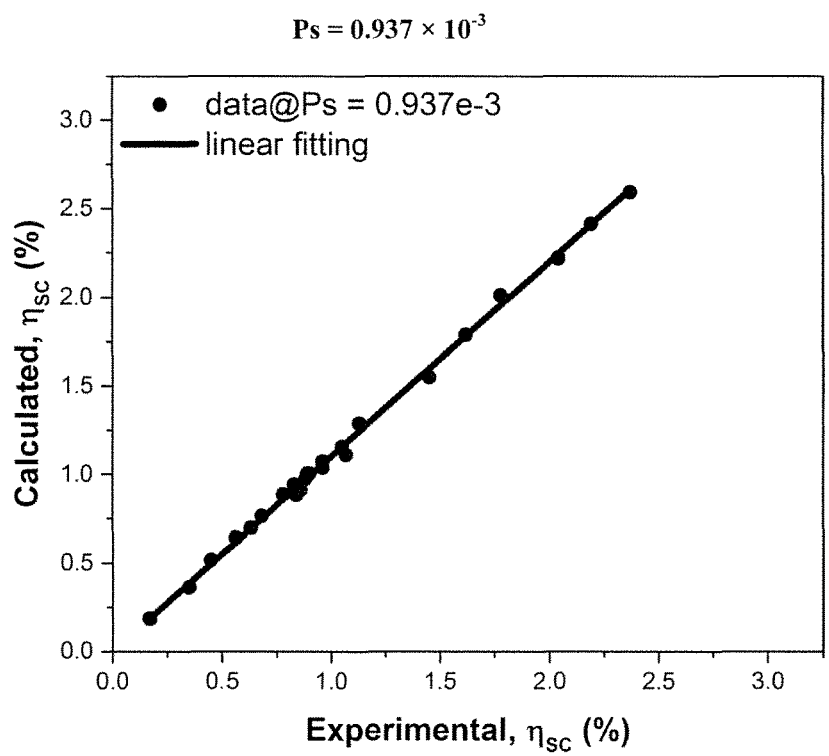
Figure 9J:
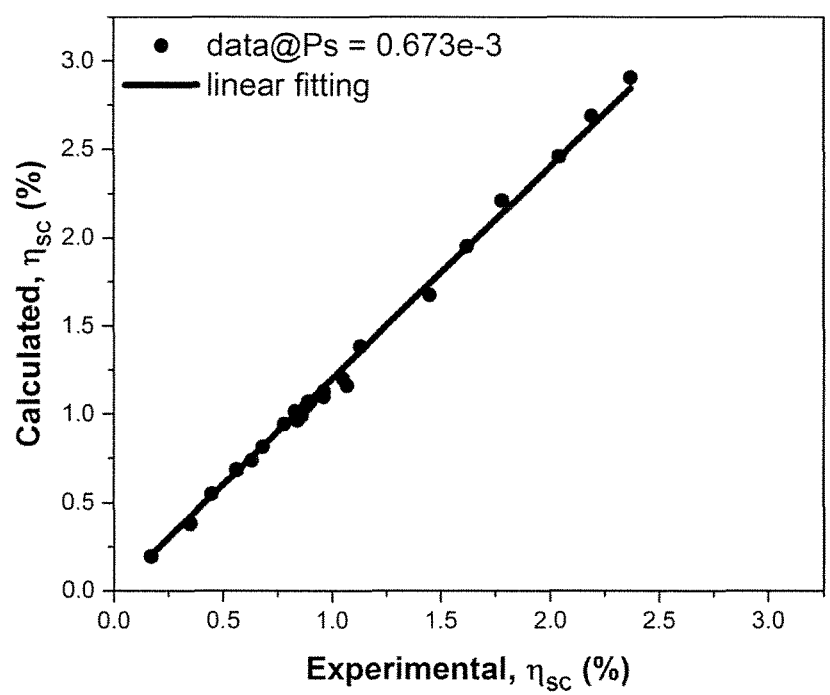
Figure 11A:
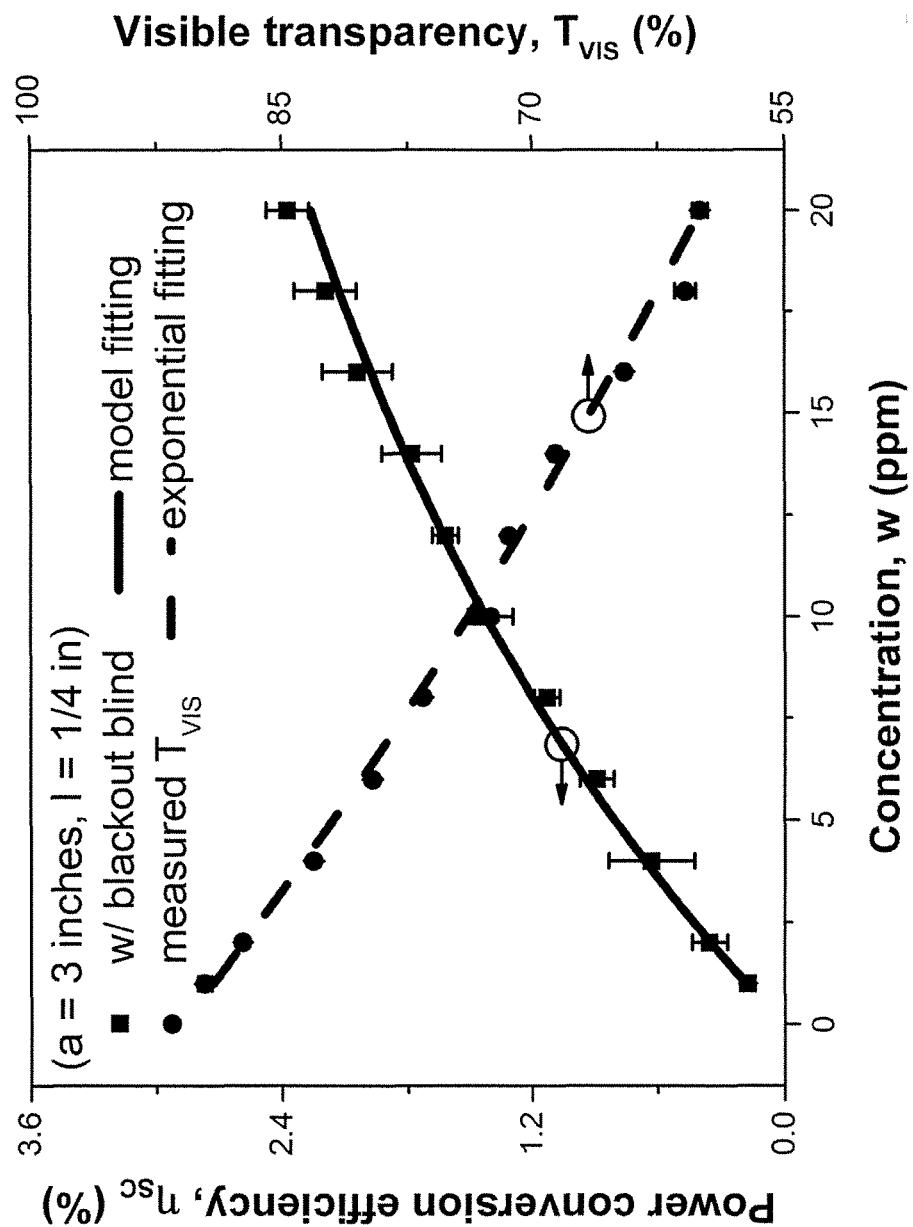
FIGS. 11a to 11c are plots that show the same pattern as those of general LSSCs at a low concentration range.
Figure 11B:
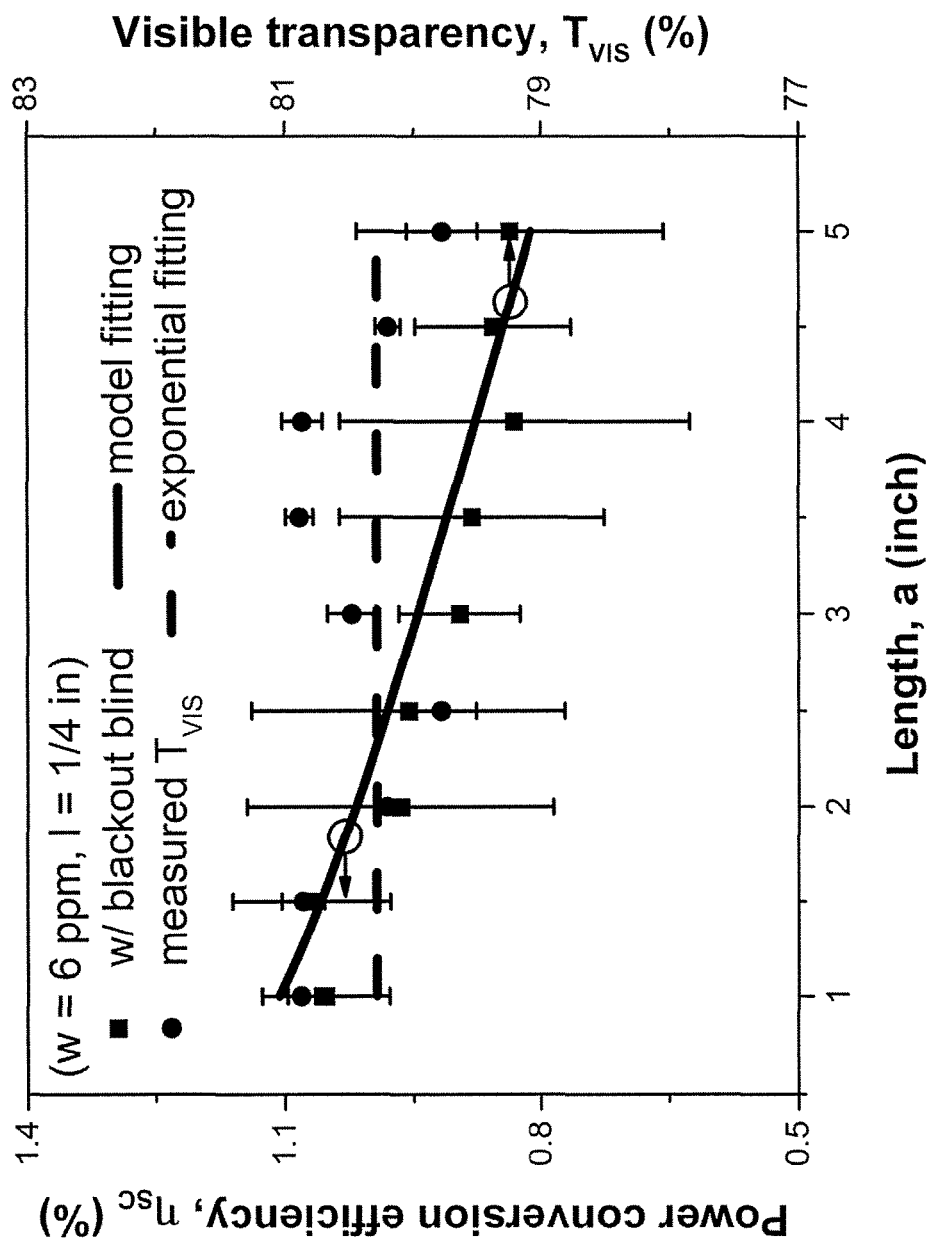
Figure 11C:
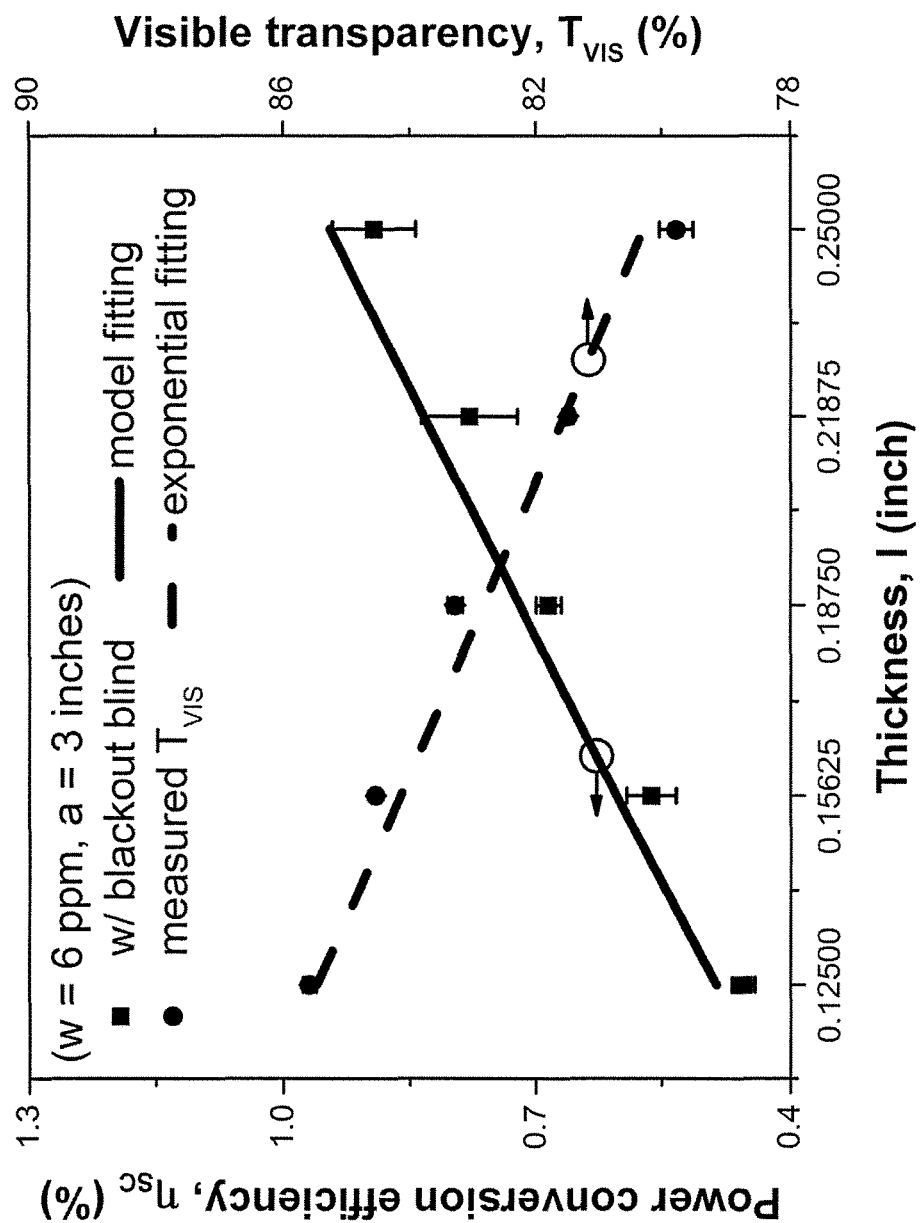

The experimental results for concentration-, length- and thickness-dependent measurements as depicted in FIGS. 11a to 11c show the same pattern as those of general LSSCs at low concentration range (w≤20 ppm), indicating that the TIR-induced edge photon delivery makes a significant contribution to $\eta_{SC}$ while the effect of scattering-induced surface photon loss is minimal. In the model fitting part, the parameters E is experimentally determined to be 0.3044 ppm$^{-1}$·in$^{-1}$ (FIG. 8b and Table 3) and the parameter P is optimized at 1.281×10−3 (FIG. 9h). Both values are consistent with the results obtained from the light scattering study on TiO$_2$ NPs. The parameter c of TiO$_2$ NP with d=500 nm is smaller than that with d=300 nm, which is consistent with the $\sigma_{VIS+NIR}$ plot in FIG. 2. The parameter P of TiO$_2$ NPs with d=500 nm is greater than that with d=300 nm, which is consistent with the Mie solution as P is defined for single particle (FIG. 1). It is noted in both concentration- and thickness-dependent measurements that trade-off is observed between $\eta_{SC}$ and T$_{VIS}$. It is obvious that T$_{VIS}$ has to be sacrificed for scattering more photons and thus obtaining high $\eta_{SC}$. The only observation that $\eta_{SC}$ changes without change in T$_{VIS}$ is found in the length-dependent measurement because altering the length does not change the optical path length (only related to thickness) and optical density (only related to concentration) of the waveguide and thus keeps T$_{VIS}$ constant. It is known that the increase of length directly increases G, which promotes the scattering-induced surface photon loss and thus causes the decrease of $\eta_{SC}$.

Figure 11D:
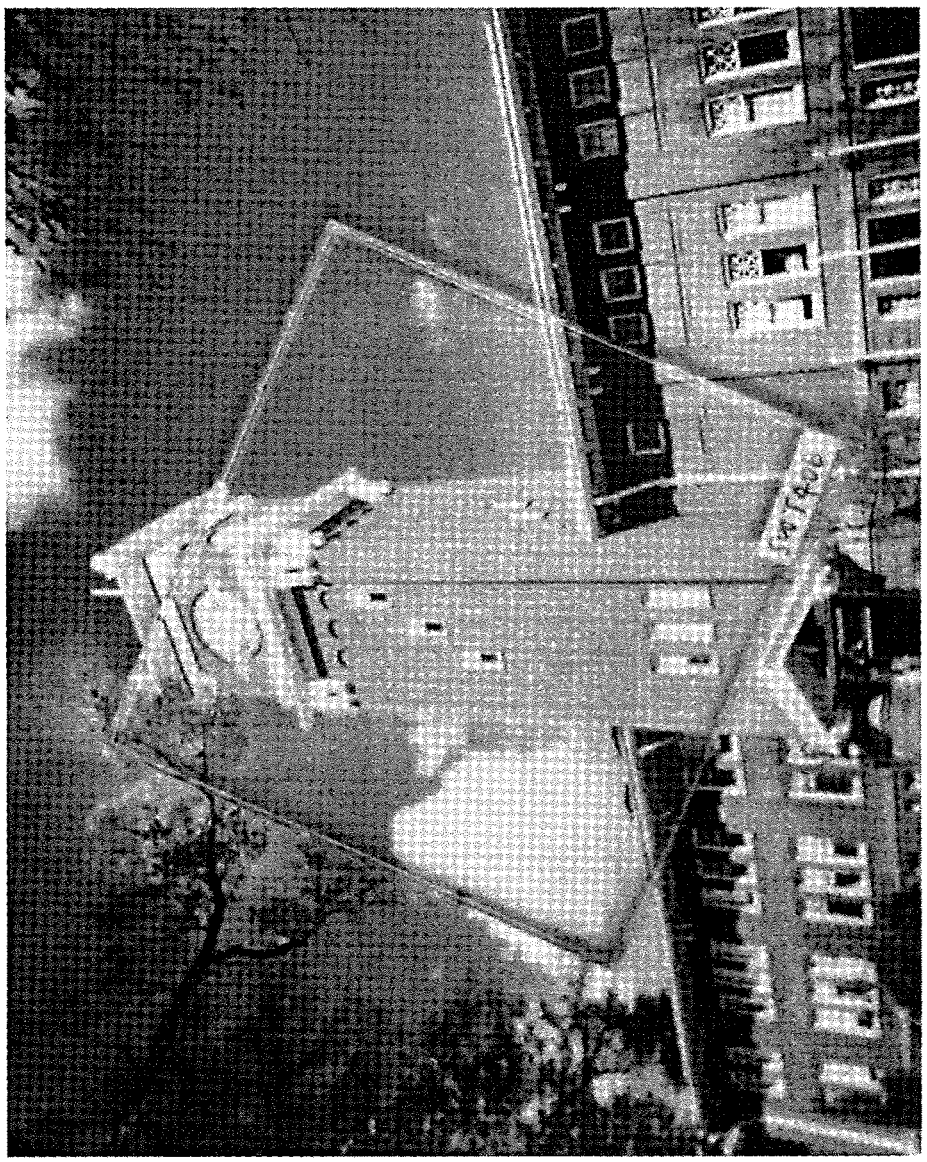
FIG. 11d is an illustration of a waveguide with $T_{VIS}$=80% on a background picture.
Figure 12A:
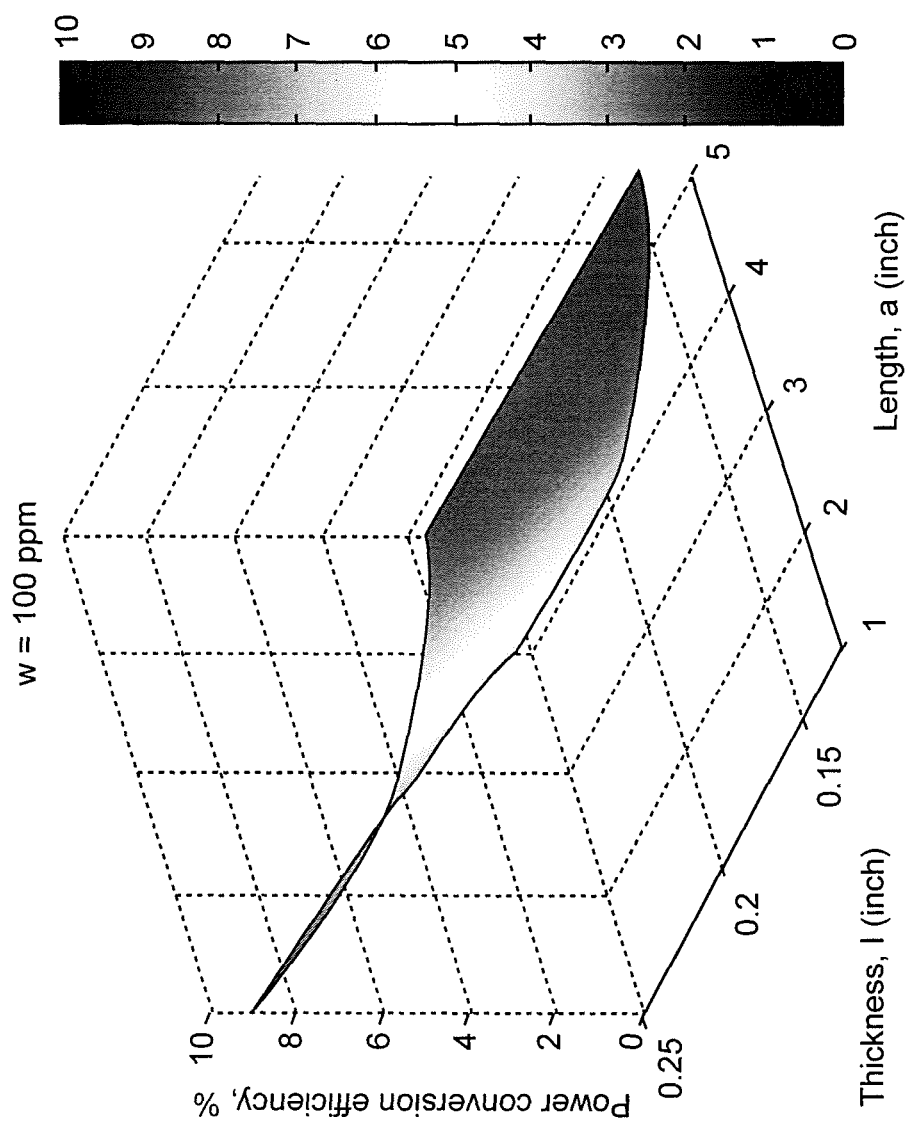
FIGS. 12a to 12f present three-dimensional (3D) graphs for $\eta_{SC}$ and C of general LSSCs depending on the waveguide length and thickness at three selected NP concentration (w=60, 100 and 200 ppm)
Figure 12B:
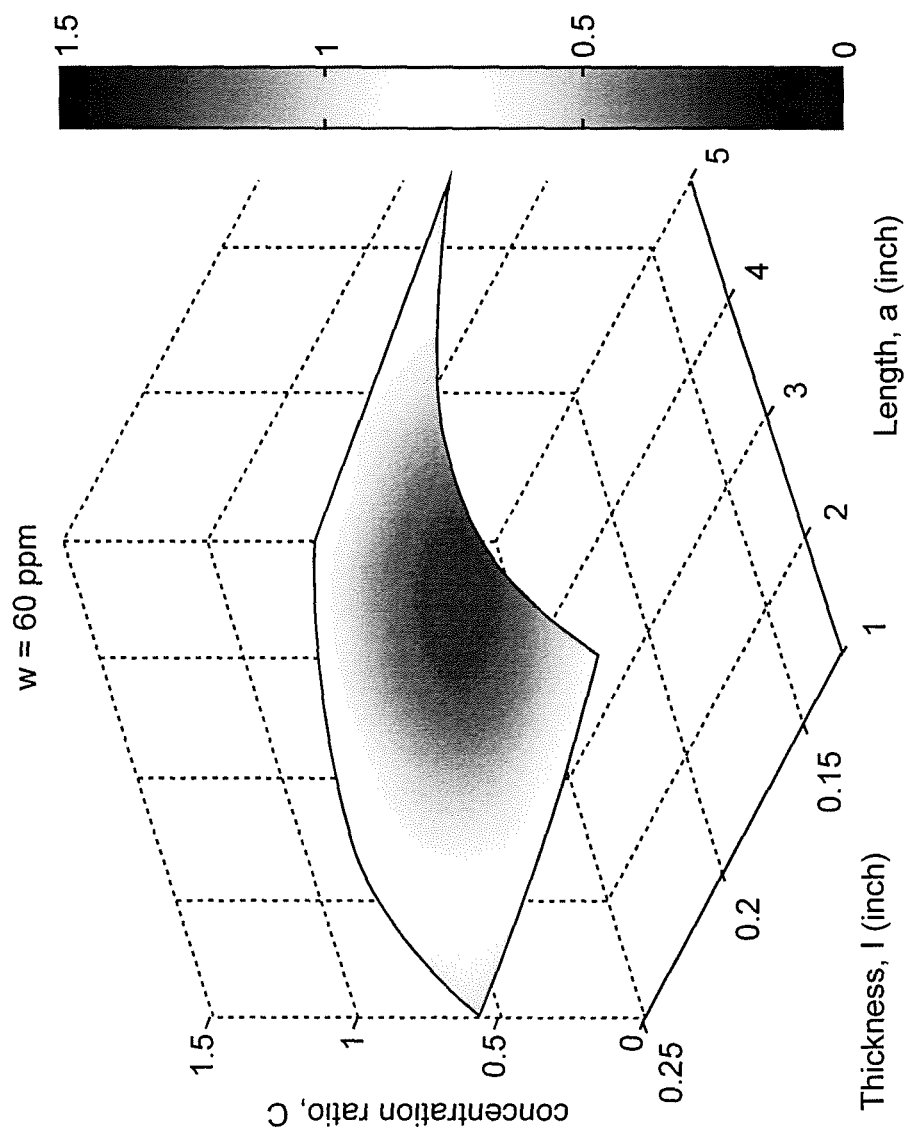
Figure 12C:
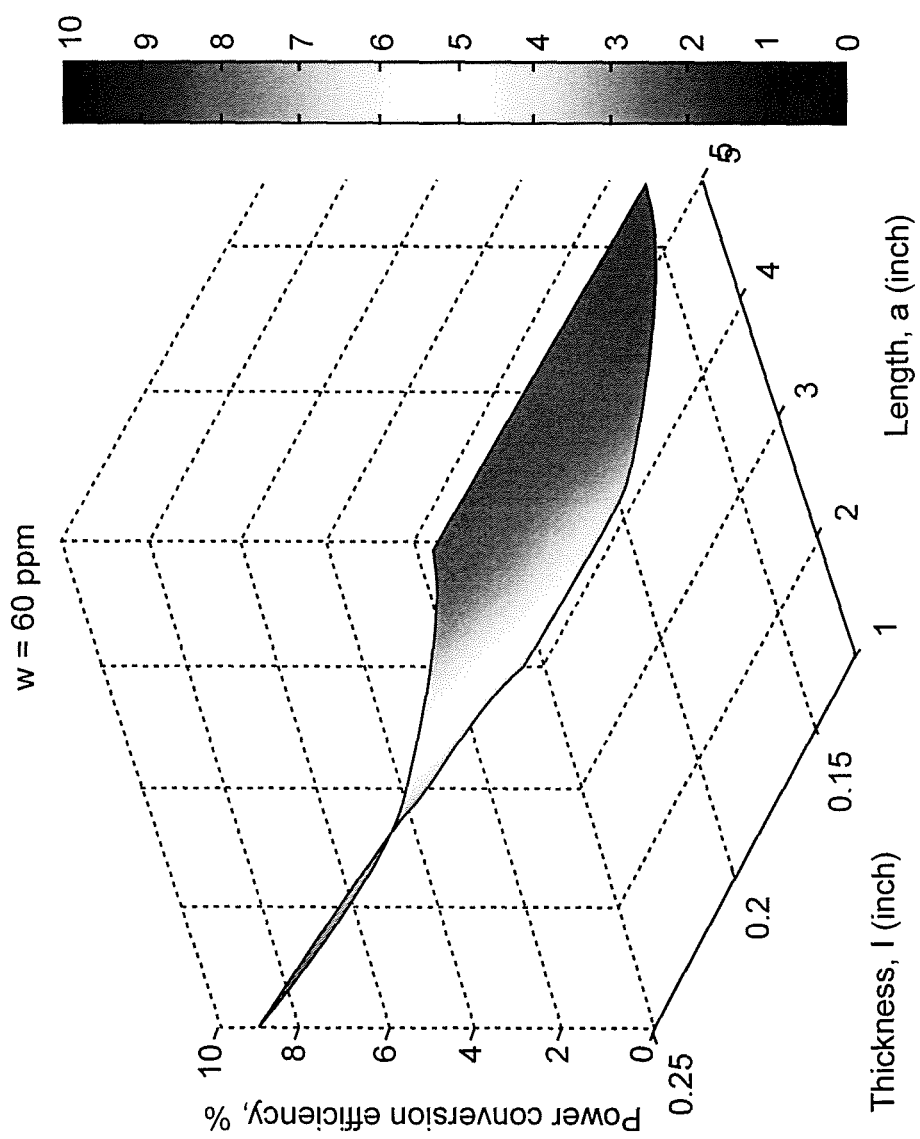
Figure 12D:
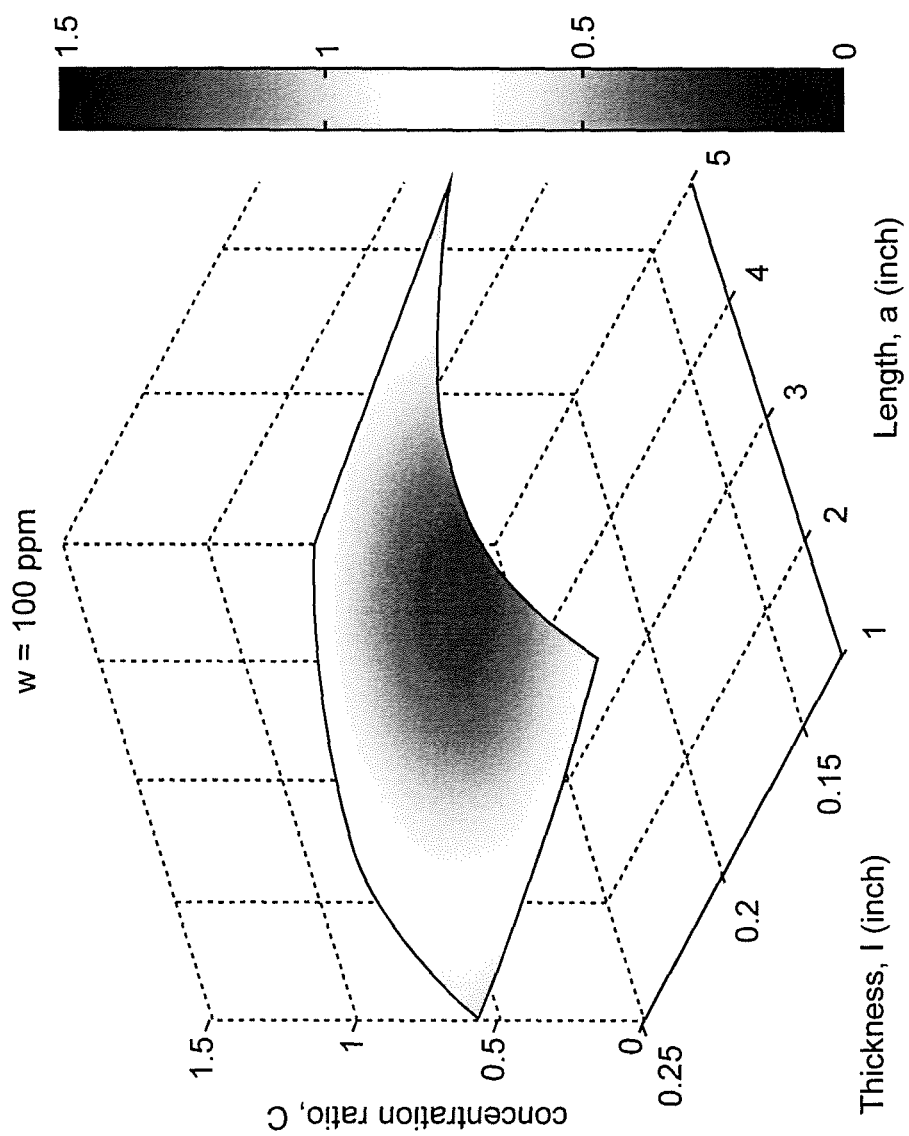
Figure 12E:
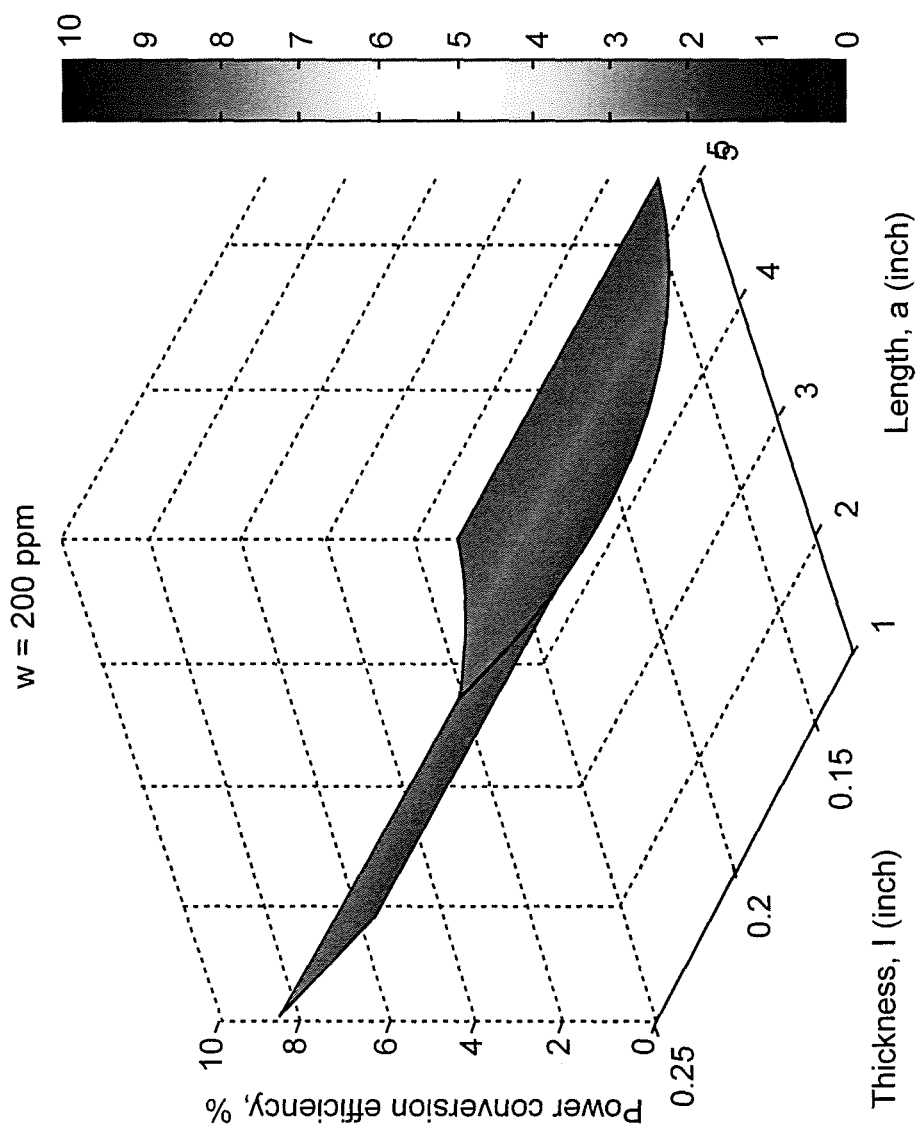
Figure 12F:
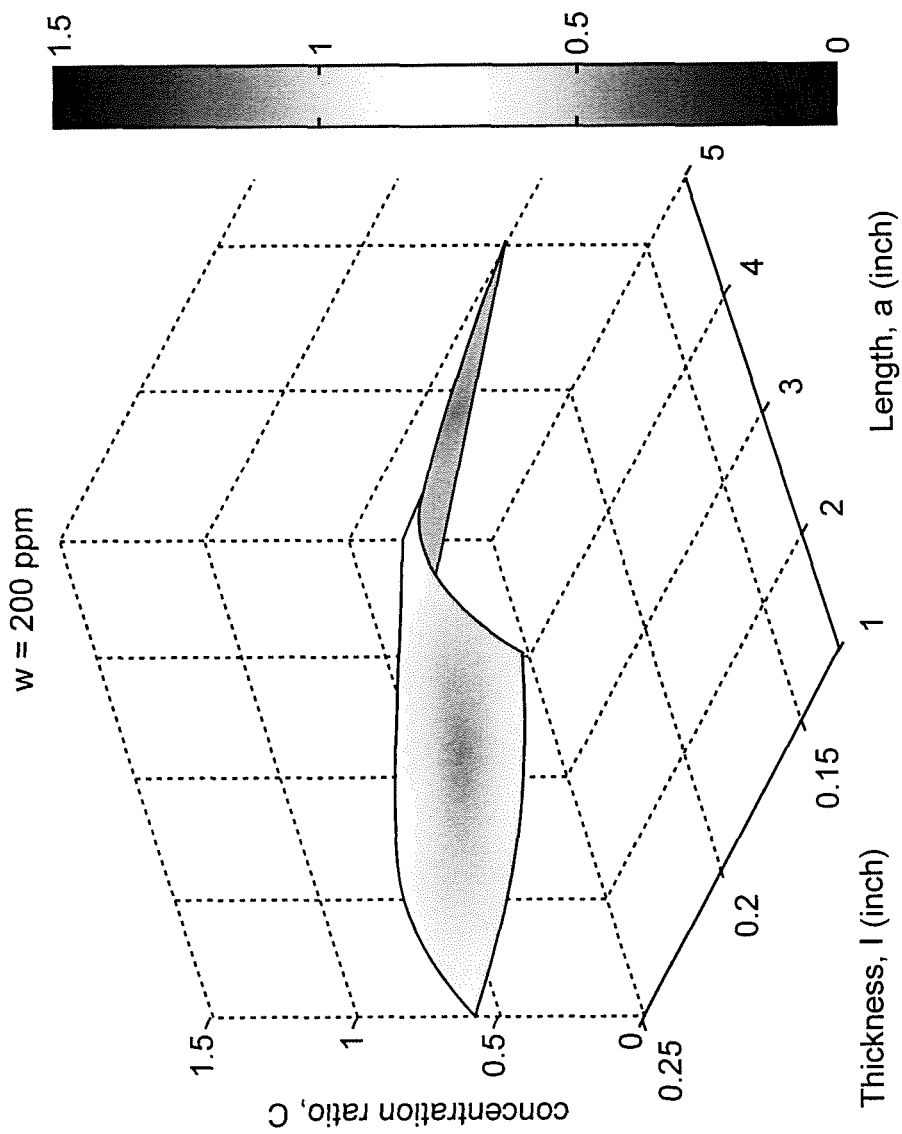

FIG. 11d presents a waveguide at w=6 ppm, a=3 inches and l=¼ inch, which exhibits T$_{VIS}$=80% and offers a clear vision through the background picture without any tint. The corresponding device demonstrates an average $\eta_{SC}$ of 0.89% and its P is about 5.9% (=0.89%/15%). It can be calculated that 11% (=TPMMA−TVIS=91%−80%) of the incident light is scattered inside the waveguide and theoretically, less than 7.7% (=11%×70%) of the incident light is trapped inside the waveguide because of TIR. So the scattering-induced surface photon loss is only about 1.8% (=7.7%− 5.9%), which is three times smaller than P and indicates that TIR-induced photon delivery predominantly contributes to $\eta_{SC}$ at low NP concentration. Although the efficiency of this transparent LSSC is much lower than that of some transparent solar cells ($\eta_{cell}$=2~4%), it is over twice higher than the current best reported transparent LSCs with 0.44% for adapting UV harvesting materials 12 and 0.40% for NIR harvesting materials. Thus, our device shows the highest value so far obtained in the category of transparent solar concentrators. The device may be used with one or more solar cells as well as with multijunction solar cells. With multijunction solar cells, the LSSC may have layers where each layer has a different band gap.

The consistency between the theoretical model and the experimental results was very intriguing, which encouraged us to search for high-performance (high $\eta_{SC}$ and over unity C) solar concentrators by tuning NP concentration, waveguide length and thickness. To start this specific task, it is necessary to identify some basic relationships between the three parameters (w, a and l) and the two target values ($\eta_{SC}$ and C). FIGS. 12a to 12f depict the three-dimensional (3D) graphs for $\eta_{SC}$ and C of general LSSCs depending on waveguide length and thickness at three selected NP concentration (w=60, 100 and 200 ppm). By simply observing the trends of these graphs, two basic conclusions can be reached. One is that there are specific ranges of the three parameters (w, a and l) for C>1 with high $\eta_{SC}$. The other is that higher NP concentration can lead to higher C but causes $\eta_{SC}$ to decrease faster when the waveguide length increases. Generally, moderate NP concentration and small waveguide thickness are desired for C>1 with high $\eta_{SC}$.

Suggested by the model results, we fabricated general LSSCs with w=100 ppm, l=⅛ inch and a varied from 2 to 3 inches. The same model analysis was also applied to the transparent LSSCs, for which w=12 ppm was selected. The experimental results and model predictions of both the general (300 nm TiO$_2$ NPs) and transparent (500 nm TiO$_2$ NPs) LSSCs are summarized in Table 5 (entry 300 nm and 500 nm).

weak diffuse reflector to reflect some incident light photons before they enter through the waveguide. Therefore, the theoretical curves in FIG. 2 under high NP concentration should exhibit a little more steeply than the original ones at w≥60 ppm. With these general LSSCs, we achieved C>1 and high $\eta_{SC}$ from 2.83% to 4.36% (entries 300 nm of Table 5), which is remarkable for the low cost non-LSC solar concentrators and comparable to current high-efficiency LSCs. We also achieved higher $\eta_{SC}$ up to 0.95% with 81% of TVIS for transparent LSSCs (entries 500 nm of Table 5), which is better than the results in our previous study ($\eta_{SC}$=0.89% and T$_{VIS}$=80% for w=6 ppm, a=3 inches and l=¼ inch). This result can be considered a landmark in the development of transparent solar concentrators.

Figure 13:
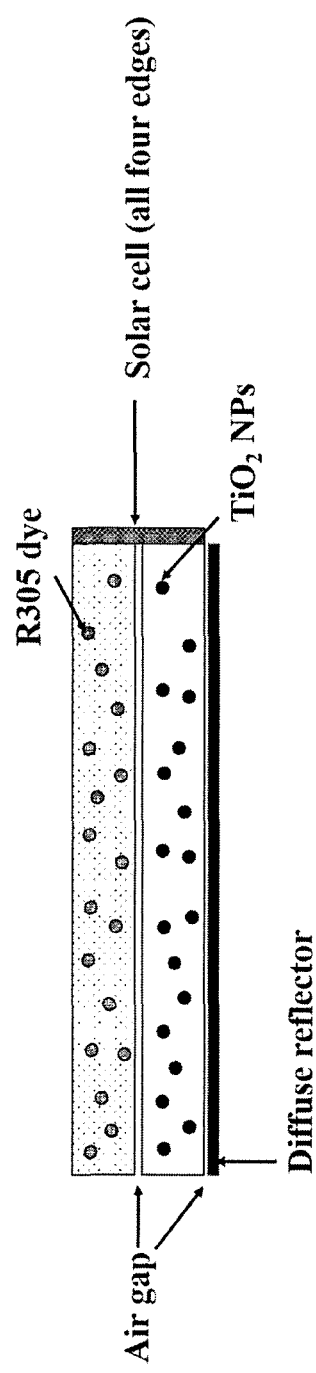
FIG. 13 is a schematic representation of a hybrid device according to an embodiment of the invention.

Although high-performance LSSCs can be achieved by controlling light scattering through manipulation of NP concentration and device size, the highest $\eta_{SC}$ obtained in our study was not higher than 5% under the condition of C>1 due to significant increase in the scattering-induced surface photon loss as the device size increases. To circumvent this problem, we propose a stacking architecture where a LSC is placed on the top of a LSSC (see schematic representation in FIG. 13). In this architecture, no index-matching agent was used to fill the air gap between two layers, ensuring that the TIR of the luminescent light in the LSC layer is not coupled with the light scattering in the LSSC layer and thus preventing the loss of the luminescent light. The short-wavelength fraction of the incident light is absorbed by the LSC layer and the long-wavelength transmitted light accompanied with the escaping light from the bottom surface of the LSC layer enters into the LSSC layer. Although this system allows a fraction of the incident light to be absorbed by the LSC before it reaches the LSSC, which decreases both the

TABLE 5

Performance of solar concentrators fabricated based on the model analysis.

| Entry (Dopant) | Concentration and dimensions | | | | Model predictions | | | | Experimental results | | | |
|---|---|---|---|---|---|---|---|---|---|---|---|---|
| | w (ppm) | a (inch) | l (inch) | G | T$_{VIS}^{cal}$ (%) | $\eta^{cal}$ (%) | P$^{cal}$ (%) | C$^{cal}$ | T$_{VIS}^{EXP}$ (%) | $\eta^{exp}$ (%) | P$^{exp}$ (%) | C$^{exp}$ |
| 300 nm$^a$ | 100 | 2 | ⅛ | 4 | — | 4.80 | 32.0 | 1.28 | — | 4.36 ± 0.22 | 29.1 ± 1.5 | 1.16 ± 0.06 |
| 300 nm$^a$ | 100 | 2.5 | ⅛ | 5 | — | 3.82 | 25.5 | 1.27 | — | 3.58 ± 0.13 | 23.9 ± 0.9 | 1.19 ± 0.04 |
| 300 nm$^a$ | 100 | 3 | ⅛ | 6 | — | 3.03 | 20.2 | 1.21 | — | 2.83 ± 0.10 | 18.9 ± 0.7 | 1.13 ± 0.04 |
| 500 nm$^b$ | 12 | 2 | ⅛ | 4 | 80 | 0.97 | 6.5 | 0.26 | 81 | 0.95 ± 0.06 | 6.3 ± 0.4 | 0.25 ± 0.02 |
| 500 nm$^b$ | 12 | 2.5 | ⅛ | 5 | 80 | 0.92 | 6.1 | 0.31 | 81 | 0.92 ± 0.03 | 6.1 ± 0.2 | 0.31 ± 0.01 |
| 500 nm$^b$ | 12 | 3 | ⅛ | 6 | 80 | 0.86 | 5.8 | 0.35 | 81 | 0.86 ± 0.04 | 5.7 ± 0.3 | 0.34 ± 0.02 |
| R305$^a$ | 300 | 2 | ⅛ | 4 | — | — | — | — | — | 3.54 ± 0.20 | 23.6 ± 1.3 | 0.94 ± 0.05 |
| R305$^a$ | 300 | 2.5 | ⅛ | 5 | — | — | — | — | — | 3.07 ± 0.14 | 20.5 ± 1.0 | 1.02 ± 0.05 |
| R305$^a$ | 300 | 3 | ⅛ | 6 | — | — | — | — | — | 2.79 ± 0.22 | 18.6 ± 1.4 | 1.11 ± 0.09 |
| 300 nm\| R305$^a$ | 100\|300 | 2 | ¼$^c$ | 2 | — | — | — | — | — | 7.58 ± 0.30 | 50.5 ± 2.0 | 1.01 ± 0.04 |
| 300 nm\| R305$^a$ | 100\|300 | 2.5 | ¼$^c$ | 2.5 | — | — | — | — | — | 6.31 ± 0.21 | 42.1 ± 1.4 | 1.05 ± 0.04 |
| 300 nm\| R305$^a$ | 100\|300 | 3 | ¼$^c$ | 3 | — | — | — | — | — | 5.26 ± 0.32 | 35.1 ± 2.1 | 1.05 ± 0.06 |

$^a$w/ diffuse reflector;
$^b$w/ blackout blind;
$^c$thickness of the stacked waveguide, each has a thickness of ⅛ inch.

It is noted that for general LSSCs, the experimental results are slightly lower than the model predications while the results of transparent LSSCs are consistent with each other. The slight difference in the results of general LSSCs can be attributed to the effect of high concentration that is not considered in our model. High NP concentration leads to the top surface of the waveguide much dense and possibly changes the waveguide/air interface, which could act like a efficiency and effectiveness of the LSSC, we expect that the top surface photon loss of the LSSC can be reduced because the escaping light enters into the LSC layer, where a fraction of it may be transported by the top waveguide (under such circumstance, the LSSC acts more like a diffuse reflector attached to the bottom of the LSC). Meanwhile, the escaping light from the bottom surface of the LSC layer enters into the LSSC layer, where a fraction of it is scattered within the bottom waveguide. Such photon recycling happens multiple times between the bottom surface of the LSC layer and the top surface of the LSSC layer until the light either escapes from the top surface of the LSC layer or transports to the edge of the stacked plate. Theoretically, such hybrid device takes both the advantages of LSC and LSSC and may lead to high-performance solar concentrators.

To test this hypothesis, we chose BASF lumogen R305, a commercial dye that is widely applied in the research of LSCs, and fabricated a series of LSCs that have the same dimensions as the general LSSCs. Due to the thin thickness of the plate (l=⅛ in), 300 ppm of the dye concentration was used to guarantee a relatively strong light absorbance. As listed in Table 5 (entry R305), the $\eta_{SC}$ of these fabricated LSCs decreases from 3.54% to 2.79% while C increases from 0.94 to 1.11 with waveguide length, which is common for LSCs and consistent with previous reports, suggesting that the increase of device size typically increases the photon transport length inside the waveguide and thus increases the photon loss due to the self-absorption of the dye.

The experimental results from the hybrid devices are impressive. In Table 5 (entry 300 nm|R305 nm), it shows that these hybrid devices exhibit exceptional high $\eta_{SC}$ from 5.26% to 7.58% with C>1, making them high performance with both high-efficiency and effective. It is noted that the optical efficiency of these hybrid devices are relatively high from 35% up to 51%, implying that over half of the solar power is converted. In our study a silicon solar cell with $\eta_{cell}$=15% was used. If we apply high-efficiency III-V GaAs solar cells ($\eta_{cell}$=24.4%) to this hybrid system, it is possible to achieve $\eta_{SC}$>10%, towards which numerous efforts have been made in the development of high-performance solar concentrators. In addition, due to the scattering and concentration of the entire solar spectrum by the hybrid system, a wide variety of multi-junction solar cells can be used to achieve $\eta_{SC}$ from 15% to over 20%.

In summary, a series of high-performance LSSCs have been presented based on the concept of light scattering by $TiO_2$ NPs. In order to describe the solar light scattering capability of $TiO_2$ NPs at unit weight in ensemble samples, we defined a new parameter $\sigma_g^{sun}$ from the Mie solution, which solely depends on particle diameter. Results from study of $\sigma_g^{sun}$ support our rationale to fabricate our general and transparent LSSCs using different sizes of the NP. Both experimental and theoretical studies suggest that the $\eta_{SC}$ and C of these devices can be tuned by controlling the degree of light scattering through the manipulation of NP concentration and device dimensions. Our LSSC devices exhibit several advancements in current solar concentrator research. Our general LSSCs with G=4~6 show $\eta_{SC}$=2.83~4.36% and C=1.13~1.19 that were measured outdoor under real-time sunny condition. These results are comparable to current high-efficiency LSCs, which typically have small G (G≤2.5) and low C (C<0.75) and are measured using solar simulators. The fabricated transparent LSSC devices achieve $\eta_{SC}$=0.86~0.95% with $T_{VIS}$=81%, which are superior to the best transparent LSCs reported. More significantly, under our current experiment settings, we developed an optimized hybrid device with the architecture of LSC stacking on LSSC, which exhibit high efficiency up to 7.58%. This is the first effective (C>1) device that is capable of concentrating over 50% of the solar energy.

Comparing to traditional LSC approach, our concept of LSSC provides a viable format of solar concentration system to accelerate its PV application because of its high-efficiency and effectiveness. Such design is also capable of reducing the production cost of the solar concentrators significantly because of the abundancy and cheapness of $TiO_2$ NPs. Another merit of our LSSC concept is that the device is capable of concentrating the entire solar spectrum if the sizes of $TiO_2$ NPs are appropriately selected. The only concern for practical application of our LSSCs is how to improve parameter C of the devices. Reported in this study, the parameter C of our devices is not as higher as expected. Our modeling results shown in FIG. 12 suggest that the C of devices will be less than 1.5. Low values of C are also expected for traditional LSC. It is known multiple factors, such as spectroscopic properties of fluorophores, surface photon loss, and size of the device, can affect the parameter C of the traditional LSC, which will make it difficult to fabricate a high C device. However, for our LSSC design, there is only one factor that affects the C of the device, i.e., the photon loss from the top surface of the device after each scattering event occurred within the waveguide.

Figure 14:
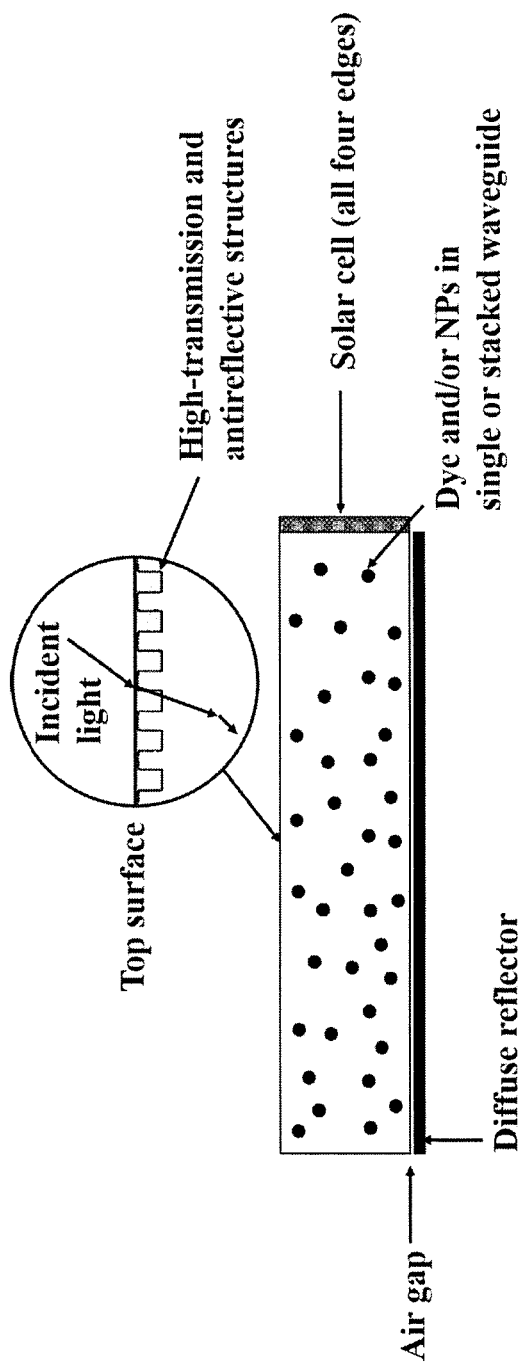
FIG. 14 is a schematic representation of a device with less surface photon loss according to an embodiment of the invention.

Theoretically, there is about 13% (equal to 0.5·F in equation (3)) chance for a photon to escape from the top surface of the device after each scattering event. When multiple scattering are needed for photons reaching the edges, such low possibility will lead to significant photon loss. Therefore, any means that reduces photon surface escape can significantly improve the C, thus, the performance of the device. With advancements in technologies of nanofabrication, particularly nano-photonic developments, several approaches can be implemented to our LSSC design to reduce the possibility of photon surface loss. One approach is modifying the top surface with a layer of anti-reflective coating combined with photon trapping nanostructures. Various biologically mimic structures, typically having a dense of arrays of nanostructure such as nanopillar structure, have been widely used as anti-reflective layer for light management in photonic field. Similar nanostructure have been also explored as light trapping structure in PV to manipulate light at a subwavelength scale to effectively enhance and control light scattering processes within PV device. Therefore, it is possible to fabricate a layer of nanostructure combining anti-reflective and light trapping on the top surface of LSSC device as shown in schematic representation in FIG. 14 to reduce top surface photon loss. More particularly, the device shown in FIG. 14 comprises a layer of nanostructure combining anti-reflective and light trapping. The smooth surface of the layer allows the entire solar photons entering the device with minimal reflection and the highly ordered 3D nanostructures of the layer toward inside of the waveguide will act as light trapping units to reduce the possibility of photon surface escape.

Figure 15:
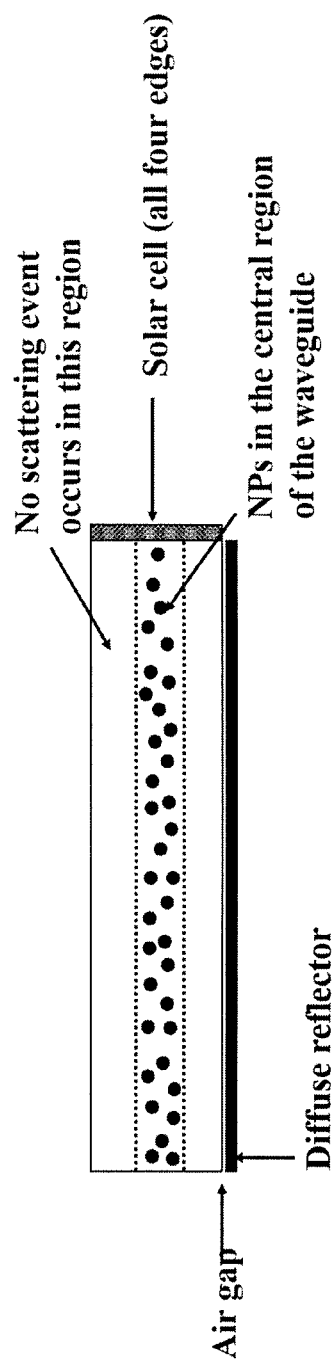
FIG. 15 is a schematic representation of a device with a layer of nanostructure combining anti-reflective and light trapping according to an embodiment of the invention.

Another approach to reducing the possibility of photon surface escape is to minimize the number of scattering event before the photons reach to the edges. This can be accomplished by reducing the thickness of the scattering layer within the waveguide (see schematic representation in FIG. 15). Such sandwich-like design decreases the parameter Ps in equation (4) and thus allows the scattered photons to transport within the waveguide with low probability to be re-scattered. Other technologies in terms of light scattering managements can also be adapted to the device for the purpose. For example, directional control of the light scattering by silicon NPs accompanied with angular-selective technology can be applied to manipulate the direction of the scattered photons to make them efficiently transport to the edges. Besides the spherical nanoparticles, nanomaterials with other shapes and types (e.g., block shape and core-shell type) can also be applied because of their tunable light scattering properties. We expect that implementing these approaches into our LSSC and hybrid designs will make the devices more efficient and effective for practical applications.

A certain amount of $TiO_2$ NPs and 0.1% AIBN as free radical initiator were added to methyl methacrylate (MMA). The resulting mixture was sonicated until the $TiO_2$ NPs were uniformly dispersed. The mixture was then stirred in a water bath at 85° C. During the heating, the viscosity of the mixture gradually increased. When the viscosity of the mixture looks like higher than that of glycerol, the heating was stopped and the flask was transferred into an ice/water bath at 0° C. After being cooled down, the mixture was poured into a glass mold. The mold was placed in an oven at 45° C. for 48 h. At the end of this thermal treatment, the mixture turned into solid and was further cured at 100° C. for 2 h. After being cooled down, the plate can be easily separated from the glass mold. The raw plate was cut and polished into the plate with desirable dimensions.

The solar cells used in the experiments were commercial silicon solar cells. After the die-saw processes and/or wire soldering, the $\eta_{cell}$ dropped from the reported 18+% down to 15±0.8% with $J_{sc}$=37.6±1.9 mA·cm$^{-2}$, $V_{oc}$=587±2 mV and FF=0.68 measured by a sourcemeter (Keithley). The solar cells were glued by UV-curable liquid optical clear adhesive to the four edges of the plate and then connected in series. A diffuse reflector (WhiteOptics) or a blackout blind (Edmund Optics) was directly attached to the bottom of the plate.

Due to the facility limitation for measuring large area (>1 cm$^2$) device, the measurement of $\eta_{SC}$ was conducted outdoor under cloudless and real-time sunny condition with the solar power density at 1000±100 W·m-2, measured by a solar power meter (Amprobe). Although such condition brought about 10% uncertainty to the measurement, it was considered producing more practical results.

The $T_{VIS}$ of transparent LSSCs are calculated by $$T_{VIS} = \frac{\int_{400nm}^{700nm} \phi_{sun}(\lambda) T_m(\lambda) d\lambda}{\int_{400nm}^{700nm} \phi_{sun}(\lambda) d\lambda}, \quad (5)$$

where $T_m(\lambda)$ is the transmission spectrum of the waveguide from 400 nm to 700 nm and directly obtained from the UV-Vis spectrometer.

The LSSC can be used in a wide variety of applications. For example, they can be used on the sidings of residential homes and office building, the outside tiles or windows of commercial office buildings and homes, and on cases for electronic products such as mobile telephones, tablet and portable computers, Ipods®, hand held gaming systems, automobile and hand held navigation systems, hand held ham radios, etc. In some applications the aesthetics of these materials can be improved by applying or stacking a luminescence solar concentrator (LSC) on the LSSC to form a hybrid device. Different dyes can be used in the LSC to tune, for example, the color of the sidings, tiles, or phone cases.

In the LSSC, the NPs are distributed in a binder or section of a binder which is generally transparent and thermostable. The NPs are high dielectric oxide NPs with a refractive index greater than 2.0, and include $TiO_2$, ZnO, MgO, and other metal oxides, and can include mixtures of these different metal oxides. The NPs are typically in the range of 100 nm to 800 nm and more preferably in the range of 250 nm to 500 nm. Typically, the characteristics of a good binder for the solar concentrator structure include being optically transparent for light (400 nm-1100 nm) and thermal/photo radiation stable with a refractive index preferably of 1.4-1.8. Examples of suitable binders include glass, polymethyl-methacrylate (PMMA) glass, polycarbonate glass, polydimethylsiloxane (PDMS) polymer, and perfluorinated polymer based optical materials. In some applications, one or more fluorescence particles may also be distributed in the binder with the NPs. In still other applications, dyes may be incorporated in the binder or in materials adjacent the LSSC.

Figure 16:
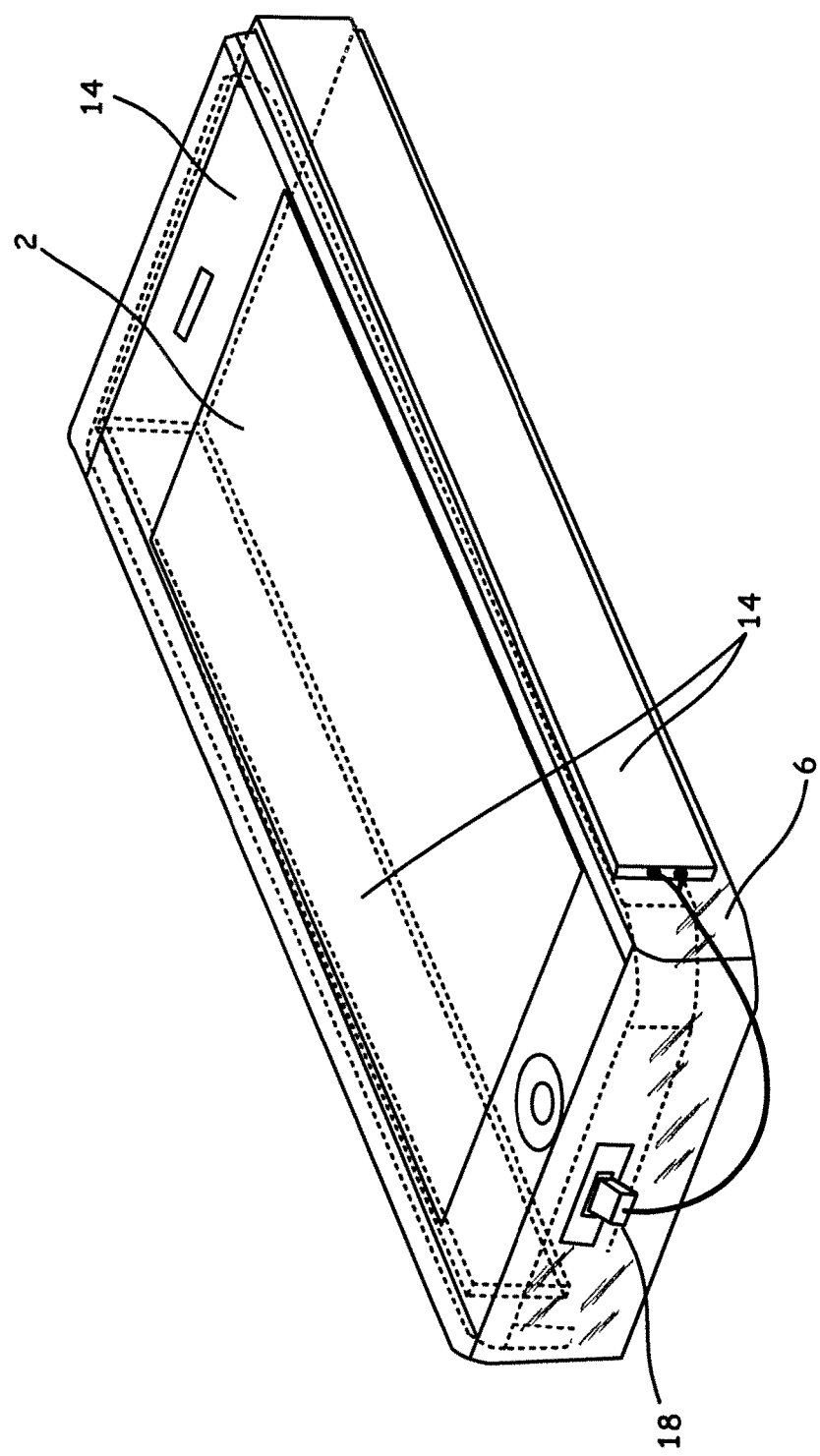
FIG. 16 is an illustration of one embodiment of the invention being employed as a mobile telephone case.

FIG. 16 shows an example of the invention being used a phone case. In particular, FIG. 16 shows a phone 2 with a major surface of the configured phone case 6 arranged as a solar concentrator, as disclosed herein, such as, but not limited to, a stacked LSC/LSSC. Moreover, the side edges include a photovoltaic cell 14, such as a silicon photovoltaic or as another example, a multi junction voltaic thin cell (e.g., solar cell) capable of being coupled to the solar concentrator (LSC). Often, an index matching material is arranged therebetween the solar cell and the photovoltaic so as to enhance coupling of desired photons. Electrical connectors 18 on the case 6 connect the solar cell(s) 14 to the mobile telephone 2 which fits within or partially within the phone case 6 cover.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A light scattering-based solar concentrator (LSSC) for photovoltaic (PV) applications, comprising:
   a plurality of solar cells;
   dielectric oxide nanoparticles (NPs) having a refractive index greater than 2.0 dispersed in a binder formed as a waveguide attached to the plurality of solar cells,
   wherein the NPs are confined to a central scattering layer sandwiched between non-scattering layers within the waveguide and said non-scattering layers do not contain NPs,
   said LSSC having at least one layer of nanostructure combining anti-reflective and light trapping on a surface toward an inside of the waveguide to reduce photon surface loss, and
   one or more reflectors are attached to one or more surfaces of the waveguide to reflect transmitted light,
   wherein the LSSC has a device concentration ratio C>1 and a device power conversion efficiency ($\eta_{SC}$) from 5.26% to 7.58%, where C is the device concentration ratio, which is the ratio between output electrical power from the solar concentrator ($P_{SC}$) and the output electrical power of the solar cells ($P_{cell}$) under the same incident condition as defined by the following equation:

$$C = \frac{P_{SC}}{P_{cell}} = \frac{\eta_{SC} A_{SC} H_{in}}{\eta_{cell} A_{cell} H_{in}} = \frac{\eta_{SC}}{\eta_{cell}} \times \frac{A_{SC}}{A_{cell}} = P \times G$$

where G is device geometric gain and is defined as the ratio between $A_{SC}$ and $A_{cell}$, where $A_{SC}$ is top surface area of the device and $A_{cell}$ is the area of the solar cells, P is device optical efficiency defined as the ratio between the device power conversion efficiency ($\eta_{SC}$) and the cell conversion efficiency ($\eta_{cell}$), and $H_{in}$ is the incident power density.

2. The LSSC according to claim 1 further comprising a luminescence solar concentrator (LSC) placed on top of the LSSC to form a hybrid structure.

3. The LSSC according to claim 1 wherein the NPs have a diameter in a range of 100 nm to 800 nm.

4. The LSSC according to claim 3 wherein the NPs have a diameter in a range of 250 nm to 500 nm.

5. The LSSC according to claim 1 wherein the NPs are uniformly dispersed in the binder.

6. The LSSC according to claim 1 wherein the binder includes one or more of polymethyl methacrylate (PMMA) or methyl methacrylate (MMA).

7. The LSSC according to claim 1 wherein the NPs are $TiO_2$ having diameter sizes ranging from 100 nm to 800 nm.

8. The LSSC according to claim 7 wherein the binder is at least one polymer selected from the group consisting of polymethylmethacrylate, polycarbonate, polydimethylsiloxane polymer, and peflourinated perfluorinated polymer.

9. The LSSC according to claim 7 further comprising one or more fluorescence particles dispersed in the binder.

10. The LSSC according to claim 1 further comprising one or more fluorescence particles dispersed in the binder.

11. The LSSC of claim 1, wherein said non-scattering layers comprise at least one polymer selected from the group consisting of polymethylmethacrylate, polycarbonate, polydimethylsiloxane, and perfluorinated polymer.

* * * * *